(12) United States Patent
Le Neel et al.

(10) Patent No.: US 8,338,192 B2
(45) Date of Patent: Dec. 25, 2012

(54) HIGH PRECISION SEMICONDUCTOR CHIP AND A METHOD TO CONSTRUCT THE SEMICONDUCTOR CHIP

(75) Inventors: Olivier Le Neel, Irving, TX (US); Feng Zhou, Irving, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 12/465,564

(22) Filed: May 13, 2009

(65) Prior Publication Data

US 2009/0283860 A1    Nov. 19, 2009

Related U.S. Application Data

(60) Provisional application No. 61/052,898, filed on May 13, 2008.

(51) Int. Cl.
*H01L 21/66* (2006.01)

(52) U.S. Cl. ...... 438/13; 438/17; 438/382; 257/E21.521; 257/E21.531

(58) Field of Classification Search .............. 438/13, 438/17, 382; 257/538, E21.004, E21.521, 257/E21.531, E29.325; 338/202, 308, 322–325, 338/328, 330
See application file for complete search history.

(56) References Cited

U.S. PATENT DOCUMENTS

| | | | | |
|---|---|---|---|---|
| 3,266,005 A | * | 8/1966 | Balde et al. | 338/308 |
| 3,930,304 A | * | 1/1976 | Keller et al. | 438/6 |
| 4,298,856 A | * | 11/1981 | Schuchardt | 338/195 |
| 4,560,583 A | * | 12/1985 | Moksvold | 438/11 |
| 4,906,966 A | * | 3/1990 | Imamura et al. | 338/195 |
| 5,455,449 A | * | 10/1995 | Inn | 257/578 |
| 5,753,391 A | * | 5/1998 | Stone et al. | 430/22 |
| 5,757,264 A | * | 5/1998 | Petit | 338/195 |
| 6,001,663 A | * | 12/1999 | Ling et al. | 438/17 |
| 6,040,605 A | * | 3/2000 | Sano et al. | 257/369 |
| 6,404,019 B1 | * | 6/2002 | Reith et al. | 257/368 |
| 6,410,356 B1 | * | 6/2002 | Wojnarowski et al. | 438/15 |
| 6,448,793 B1 | * | 9/2002 | Barratt et al. | 324/693 |
| 6,962,875 B1 | * | 11/2005 | Stamper | 438/672 |
| 7,033,873 B1 | * | 4/2006 | Lall et al. | 438/174 |
| 7,089,525 B2 | * | 8/2006 | Tamaki et al. | 438/164 |
| 7,250,313 B2 | * | 7/2007 | Howland, Jr. | 438/17 |
| 7,521,761 B2 | * | 4/2009 | Satsukawa | 257/350 |
| 7,941,776 B2 | * | 5/2011 | Majumder et al. | 716/122 |
| 2002/0134993 A1 | * | 9/2002 | Leighton et al. | 257/177 |
| 2003/0122056 A1 | * | 7/2003 | Wada et al. | 250/214.1 |
| 2004/0007776 A1 | * | 1/2004 | Chen | 257/738 |
| 2004/0079996 A1 | * | 4/2004 | Tamaki et al. | 257/347 |
| 2004/0093110 A1 | * | 5/2004 | Chong et al. | 700/121 |
| 2004/0216067 A1 | * | 10/2004 | Tanaka et al. | 716/10 |
| 2005/0192700 A1 | * | 9/2005 | Holfeld et al. | 700/121 |
| 2005/0200416 A1 | * | 9/2005 | Diorio et al. | 330/277 |

(Continued)

FOREIGN PATENT DOCUMENTS

JP    59121966 A    * 7/1984

*Primary Examiner* — Jarrett Stark
*Assistant Examiner* — Michele Fan
(74) *Attorney, Agent, or Firm* — Seed IP Law Group PLLC

(57) ABSTRACT

An embodiment for manufacturing an electronic circuit forms at least one first structure on a semiconductor substrate, determines at least one electrically defined characteristic of the at least one first structure, selects a reticle corresponding to the measured characteristic, and forms at least one additional structure on the semiconductor substrate with the selected reticle.

12 Claims, 14 Drawing Sheets

U.S. PATENT DOCUMENTS

| | | |
|---|---|---|
| 2006/0087401 A1* | 4/2006 | Kerr et al. ............... 338/309 |
| 2006/0213778 A1* | 9/2006 | Cheng et al. ............. 205/105 |
| 2008/0061324 A1* | 3/2008 | Yoshida et al. .......... 257/255 |
| 2008/0080227 A1* | 4/2008 | Duch et al. ............... 365/148 |
| 2008/0139238 A1* | 6/2008 | Anand ...................... 455/550.1 |
| 2008/0149925 A1* | 6/2008 | Dusa et al. ............... 257/48 |
| 2008/0237800 A1* | 10/2008 | Chinthakindi et al. ... 257/537 |
| 2009/0178271 A1* | 7/2009 | Egitto et al. ............. 29/620 |

\* cited by examiner

HIGH PRECISION SEMICONDUCTOR CHIP AND A METHOD TO CONSTRUCT THE SEMICONDUCTOR CHIP

BACKGROUND

1. Technical Field

Embodiments of semiconductor chips are fabricated with processes that include illuminating un-masked portions of a semiconductor wafer through a reticle during a photo-lithographic step.

2. Description of the Related Art

Electronic circuits, which are fabricated on semiconductor substrates, perform a variety of functions. Some examples are electronic circuits formed as amplifiers, filters, and/or power supplies. In some cases, many circuits are formed on a single semiconductor substrate to provide a multitude of functions. The end product of the fabrication is commonly called a semiconductor "chip" or integrated circuit.

The electronic circuits are often constructed on a semiconductor substrate. The substrate may initially be a single wafer, and after several electronic circuits are formed, the wafer is cut into many individual semiconductor chips. Later, each chip may be packaged in its own plastic or other suitable housing for use in an electronic system.

The process of semiconductor fabrication is expensive and time consuming. Thus, the quantity and quality of the integrated circuits is often very important for a high yield and good financial earnings. Another method is to make smaller circuits that use less area. A third method is to take steps to ensure that the chips which are made operate correctly. In order to maximize return on investment, manufacturers of semiconductor chips try to maximize the number of operational chips that can be formed on a single wafer. One method of maximizing the number of operational chips formed on a single wafer may be accomplished by using all of the available space on the wafer as efficiently as possible.

The number of operational chips that can be formed on the wafer may be affected by several factors. Using current technology, the semiconductor wafer may have a diameter of 6 inches, 8 inches, 12 inches or some other suitable size. In addition to the diameter of the wafer, the number of individual chips that can be formed from a single wafer may be limited by the type, size, complexity, and function of the electronic circuits that are fabricated.

In addition to the number of chips produced from a single wafer, the quality of the circuits formed on the chips also may affect the manufacturer's return on investment. Several factors may affect circuit quality. For example, in order to operate in an acceptable manner, some circuits require components having values that fall within narrow tolerance ranges. In cases where one or more components have values that are outside of an acceptable tolerance range, the entire circuit may not operate correctly, and thus the entire chip may have to be discarded. In other cases, even when the electronic circuits operate, the operational characteristics may not fall within the desired specifications. In these cases, when one or more components have values that fall outside pre-defined tolerance ranges, the chip may be less valuable. Thus, an improvement in quality of circuits formed on the chip will increase the return on investment for the manufacturer.

BRIEF SUMMARY

A method for forming semiconductor chips that contain circuits which operate within tight tolerances of performance is disclosed. Further, a chip layout and structure that will result in an electrical circuit which performs as designed within tight tolerances is also taught.

According to one embodiment, the method includes forming a first structure on a semiconductor substrate, determining an electrical characteristic of the first structure, selecting a reticle based on the measured characteristic, and then forming an additional structure on the semiconductor substrate with the selected reticle to form additional circuit components.

According to another embodiment, a method for manufacturing an electronic component on a semiconductor substrate includes forming a plurality of structures on a substrate, each structure having a parameter different from a corresponding parameter in each other structure within the plurality of structures, determining a value of a property of the structures, forming an electrical connection to a selected structure within the plurality of structures corresponding to the determined value, and not forming electrical connections to un-selected structures within the plurality of structures.

An integrated circuit according to one embodiment of the invention includes a first structure having at least one electrical characteristic that is measurable during manufacture and a second structure formed after the first structure, the second structure having at least one dimension that is constructed based on the measurable characteristic.

According to another embodiment, a semiconductor chip comprises a plurality of potential circuit sites, one site fully constructed, the remainder of the sites not fully constructed, wherein the plurality of potential circuit sites have at least one substantially same parameter and at least one different controlled parameter.

BRIEF DESCRIPTION OF THE SEVERAL VIEWS OF THE DRAWINGS

The components in the drawings are not necessarily to scale relative to each other. For clarity, the outline of the some of structures in the drawings may be illustrated even though those structures underlie other structures. Like reference numerals designate corresponding parts throughout the several views.

DETAILED DESCRIPTION

Figure 1A:
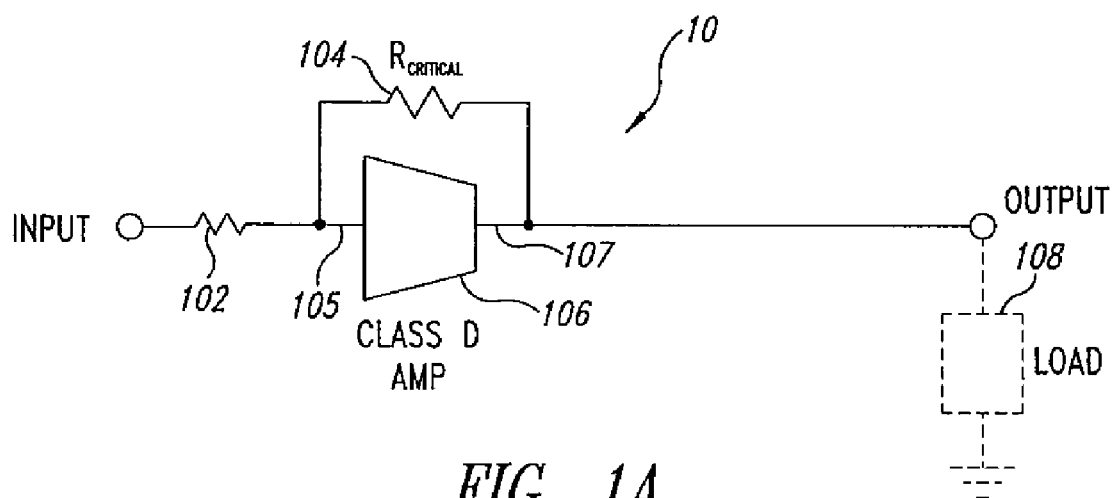
FIG. 1A is a schematic diagram illustrating an exemplary amplifier circuit that may be formed in an integrated circuit according to one embodiment of the invention.

FIG. 1A is a schematic diagram illustrating a simplified version of an exemplary amplifier circuit 10 that is formed in an integrated circuit according to one embodiment of the invention. The amplifier circuit receives a signal at an INPUT node. The input is coupled to a first node of a resistive voltage divider network formed with a first resistor 102 and a second resistor 104. A second node of the resistive voltage divider is coupled to an input 105 of a Class D amplifier 106. A third node of the resistive voltage divider is coupled to the output 107 of the Class D amplifier 106 and to a node OUTPUT. A load 108 may be coupled to the circuit at the output node OUTPUT.

The amplifier circuit 100 shown in FIG. 1A is a simple version used for illustration and in many embodiments it may be much more complex, including such features as capacitors, differentiated inputs, negative (or positive) feedback control loops. Additional negative divider circuits or other components, many such more complex amplifier circuits being well known in the art and widely published in many technical publications.

In many amplifier circuits, of which the one is shown in FIG. 1A is an example, the value of one particular component will be largely determinative of the performance of the circuit. The properties of one or more components may be more critical to circuit performance than other components.

In the resistive voltage divider network of FIG. 1A formed by two resistors connected in series, 102 and 104, the value of the feedback resistor 104 is the most critical. Each resistor has an electrically defined characteristic of a resistive value, which is measured in ohms. The resistance value of resistor 104 is more important than the resistance value of resistor 102, and so resistor 104 is identified as Rcritical. The Rcritical resistor 104 is connected in such a manner as to provide a feedback path for the class D amplifier 106. In such a configuration, the resistance value of Rcritical 104 is a key factor in determining how closely the entire circuit will perform to its desired specifications.

In this particular example of the amplifier, a key parameter of amplifier performance is the output gain. The gain is mainly dependent on the value of the loading resistance, of which the resistor 104 is a key component. Accordingly, the resistance value of resistor 104 is a critical factor in determining the circuit performance and therefore if the resistive value of this component is controlled within tight tolerances, the circuit as a whole can be assured of closely matching the design specifications. Unfortunately, in current semiconductor processing controlling the exact value of a resistance within tight tolerances is very difficult, if possible at all. Particularly, in situations in which the resistor is polysilicon and is doped by ion implantation, the resistance may vary from sample to sample, particularly in different lots. While the variation in resistance may be acceptable for circuits to operate, since the exact value of the resistance as compared to other circuit components greatly affects the circuit performance, if the resistance is exactly selected within tight tolerances, the performance of the overall circuit can be tuned to desired specification and achieve higher quality results than possible without a resistor whose value is selected with such precision.

Figure 1B:
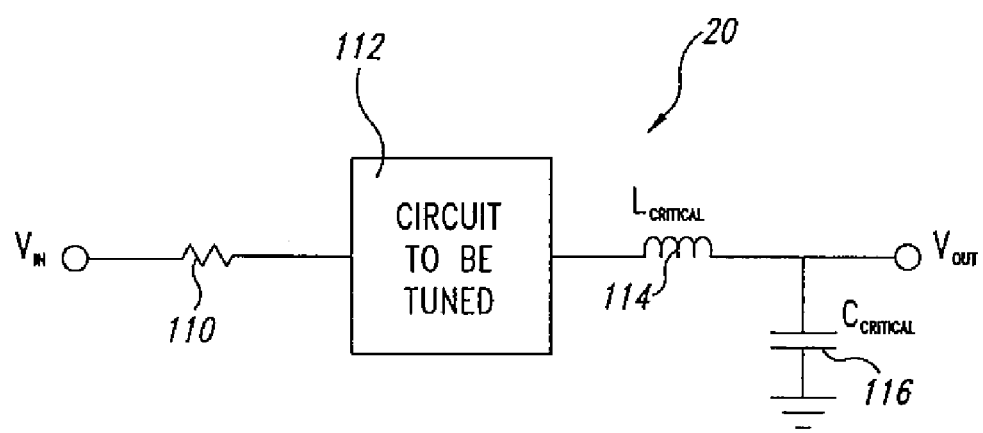
FIG. 1B is a schematic diagram illustrating an exemplary filter circuit that may be formed in an integrated circuit according to one embodiment of the invention.

FIG. 1B is a schematic diagram illustrating an exemplary filter circuit 20 that may be formed in an integrated circuit. An input to the filter circuit 20 may be received at node Vin, and an output from the filter circuit 20 may be taken at node Vout. In some cases, an input resistor 110 may attenuate the input signal to a desired voltage and/or current level, but this is not needed in all designs. The filter circuit 20 of FIG. 1B may also have a circuit to be tuned 112. In some cases, the class D amplifier 106 of FIG. 1A may be one component within the circuit to be tuned 112, and the filter may be constructed as a low-pass filter. In other cases, a different signal generation and/or signal passing circuit may be realized in the circuit to be tuned 112, and the filter may be constructed to pass a selected signal bandwidth.

The filter circuit 20 of FIG. 1B may also include an inductor Lcritical 114 and a capacitor Ccritical 116. Each inductor has an electrically defined characteristic of inductance, which is a value measurable in henrys. Each capacitor has an electrically defined characteristic of capacitance, which is a value measurable in farads.

In some cases, the values of either Lcritical 114 and Ccritical 116 may determine how closely the circuit will perform to its desired specifications. That is, if one or both of Lcritical 114 and Ccritical 116 are formed so that their values fall within specified tolerance ranges and/or other predetermined margins of accuracy, then the low pass filter permit the circuit to achieve a specific desired operational quality. Accordingly, either Lcritical 114 or Ccritical 116, like Rcritical 104, may be critical value components that closely control how effectively a particular circuit will operate. In most filter circuits, either L or C will be critical and the other's value may be less critical.

For example, in one embodiment, the value of L may be measured and the capacitance value C precisely tuned to achieve a target response, or vice versa.

Embodiments of critical value components may be components formed to have a value that falls within a preferred narrow range. When a critical value component is so formed, then the circuit and/or the chip may have operational characteristics of a quality much higher than normally achievable with standard circuit formation techniques. Further, it will usually be of sufficient quality to be accepted. When a formed critical value component has a value that falls outside of a particular range, then the quality of the circuit will be low, or may fall outside an acceptable range to eliminate the value of the entire chip.

In the exemplary circuits of FIGS. 1A-1B, different components are designated has having potentially "critical" values. In other circuits, one or more similar or different components may be designated as having a "critical" value. A critical value component may be a resistor, an inductor, a capacitor, a switch, a transistor, a diode or any other component that may be formed in an integrated circuit. Further, a critical value component may be any component formed to have a value within a predetermined tolerance range.

The electronic components on the silicon substrate are formed during the manufacturing process of the integrated circuit. Generally, a critical value component is formed at the same time as other components. Accordingly, it is desirable to use manufacturing processes that increase the likelihood that the electrical characteristics of a critical value component be constructed to be within a specified range.

Forming components to have values that fall within specified tolerance ranges may often require the control of certain parameters during chip fabrication. In some conductor device fabrications, some parameters are highly controllable and some parameters are not so highly controllable. For example, one highly controllable parameter of a structure is the linear dimensional boundaries of the particular structure which is formed during a photo-lithographic process, e.g., length, width, and/or height. In another example, a not so highly controllable parameter of the structure is the exact resistance of a strip of polysilicon resulting from doping during an ion implantation.

FIGS. 2-6E represent how an exemplary resistor, for example Rcritical 104 of FIG. 1A, is formed in an integrated circuit to have a precise desired resistance. In some cases, processes similar to those illustrated in FIGS. 2-6E may be used to form other components, for example, Lcritical 114 and Ccritical 116 of FIG. 1B, as well as components in a single crystal semiconductor substrate or in other portions of the integrated circuit.

In the examples of FIGS. 2-6E, the structures formed are formed on a substrate. The substrate is single crystal silicon with or without an epi layer, but may be made of any material suitable as a base for the formation of an integrated circuit. Accordingly, when structures or other elements are described as being formed "on the substrate," physical contact with the base substrate is not required. Rather, in some cases, one or more intermediate layers or materials may occupy the intervening space between the described structure and the actual substrate material.

The formation of structures, such as those illustrated in each of FIGS. 2-6E, may be accomplished through a variety of steps, which include material deposition, alteration, patterning, and/or removal, using any of the many techniques currently well-known in the art.

In a photo-lithographic process, the wafer under construction may be coated with a photo-reactive or a photo-resistive chemical, for example, Diazonaphthoquinone (DNQ). The photo-resistive or photo-reactive chemical may be altered when exposed to light of a certain wavelength, e.g., ultraviolet light.

After the application of the photo-sensitive chemical, a pattern projection system, a stepper for example, is fitted with a reticle having a pattern thereon. The pattern projection system has a radiation source, in one example light of the proper wavelength, and the system exposes parts of the integrated circuit with light, while the pattern blocks exposure of other parts. In such an exemplary system, the parts of the integrated circuit that are exposed to the light depend on the pattern present on the reticle attached to the light projection system. The use of reticles or masks in the production of semiconductor circuits is well known and is used within a system generally termed a photolithographic system. As smaller dimensions are made in semiconductor chips, the light based photolithographic system may use x-rays or other types of radiation in order to expose the wafer to a pattern on the reticle and thus, the generic term of a radiation projection system includes a light-based photolithographic system, x-ray system, or other types of reticle and mask-based exposure systems of the type well known and widely used in the making of semiconductor products.

After the wafer is exposed to the pattern source, known processes are used to remove selected material from the wafer and leave other material. The removal of the desired material may be by a chemical etching process, for example, with sodium hydroxide (NAOH) or tetramethylammonium hydroxide (TMAH). By this technique a mask is formed and then the etching of other layers takes place to create holes, or leave material of a desired pattern or shape on the substrate. The chosen etching process is selected to only remove the desired material.

Figure 2:
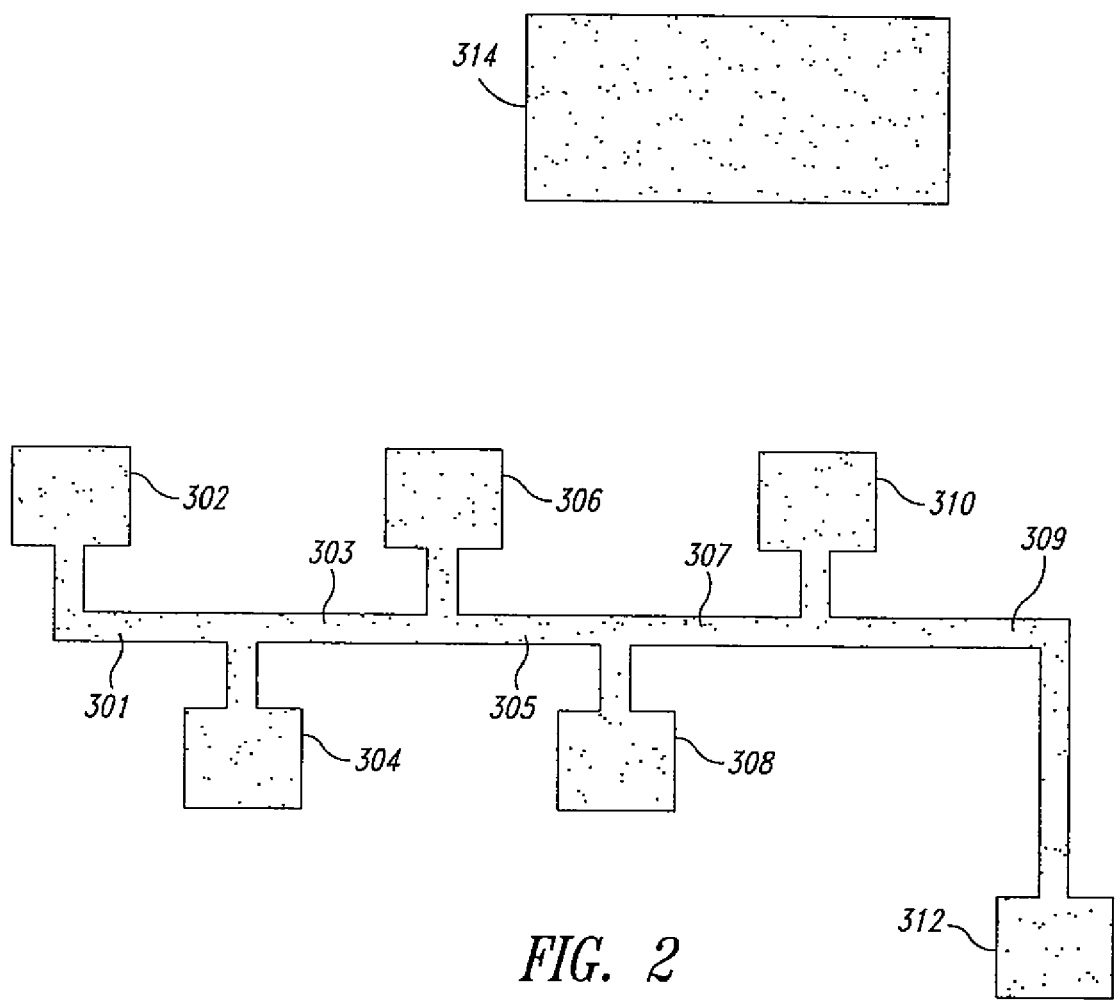
FIG. 2 illustrates a polysilicon structure for use in making the circuit of FIG. 1A.

FIG. 2 illustrates polysilicon structures 302, 304, 306, 308 and 310, and resistive segments 301, 303, 305, 307, and 309. Also shown is contact pad 312 to polysilicon 312, and a testable polysilicon structure 314, all of which are formed on a substrate (not shown). Each of the segments 301, 303, 305, 307, and 309 of FIG. 3 may be independently identified and separate; however, in the construction of this example chip, the plurality may have some parts that are interconnected. Additionally and/or alternatively, the plurality of polysilicon segments 301-310 of FIG. 2, each of which has a different length. Each segment 301-310 is a potential portion of an electronic component and wherein at least one of the polysilicon segments will be subsequently selected to become part of the resulting electronic component and some segments will not be used in some chips, whereas a different segment may be used in other chips, and all segments used in some chips.

In some embodiments, the abandoned and/or isolated segments are electrically insulated from other parts of the circuit, e.g., electrical connections are not formed. In the exemplary embodiment of FIG. 2, a base structure 312 is an integral part of an electrical component used in cooperation with one or more of the segments 301-310. For example, a combination of some or all of the polysilicon structures 301-312 shown in FIG. 2 may be used to form a resistor, such as Rcritical 104 of FIG. 1A.

The structures of FIG. 2 are formed from polysilicon that has been doped to a particular level with dopant, either one that increases conductivity, such as boron or phosphorous, or a conductivity-degrading dopant, such as nitrogen or oxygen. In some cases, the structures are formed in a high-ohmic poly-crystalline process (HIPO). Once doped, the polysilicon of FIG. 2 will have an electrically defined characteristic of a resistive value, which is a value measurable in terms of "resistivity," or ohms per square unit. Thus, a particular structure having greater length will have greater total resistance than a shorter structure formed in the same doped polysilicon. That is, when multiple resistive structures are formed the resistivity of each segment may be substantially the same, but the longer segments will have a greater total resistance and provide different values of resistors that are available to a circuit designer.

As illustrated in FIG. 2 each of the plurality of structures 301-310 may be part of or connected to one or more adjacent ones of structures 301-310. As described above, each of the plurality of structures 301-310 and the base structure 312 will have substantially the same resistivity (as measured in ohms per square unit), but the total resistance measured between structure 312 and one of structures 301-310 will be different (as measured in ohms). For example, the resistance between structure 312 and 310 will be a first value, and the resistance between structure 312 and 308 may be a second value that is greater than the first value. The difference in these two values will be based on the length and shape of resistive segment 307. Similarly, the resistance between structure 312 and structures 306, 304, and 302 will have third, fourth, and fifth values, which are greater than the first and second values, and which respectively increase in total resistance as measured in ohms.

In this embodiment for selecting a desired R, the electrically defined characteristic of resistivity of one or more structures is sensed by measurement during the fabrication process. Then, during subsequent fabrication steps, the total resistance of an electronic component is established by selecting the desired structures in correspondence to the sensed characteristic to achieve a desired final resistor value.

FIG. 2 also illustrates an optional testable structure 314 formed at the same time, in the same process steps and from the same doped polysilicon as the structures 301-312 of FIG. 2. In embodiments of a chip where a testable structure 314 is formed, it may be used to representatively measure the resistivity of the polysilicon layer. For example, as described below, a measurement of resistivity may be used in a subsequent step to determine which steps to take next in the fabrication process. The testable structure 314 is formed at a location where it can be easily tested. It may be in the scribe line of the wafer, between dies, at a corner of each chip, or some other location which permits easy testing. In one embodiment, it is a large block in the scribe line that can easily be measured by a four-point probe. In other embodiments, it is a resistor test structure of the same size and shape as segments 301-312 and a probe station is used on contact pads to measure the actual resistance of each segment. Placing such a test structure in the scribe line is preferred, but in place of the test structure 314, the resistor values of portions 301-312 can themselves be measured and the preferred resistor selected.

Figure 3:
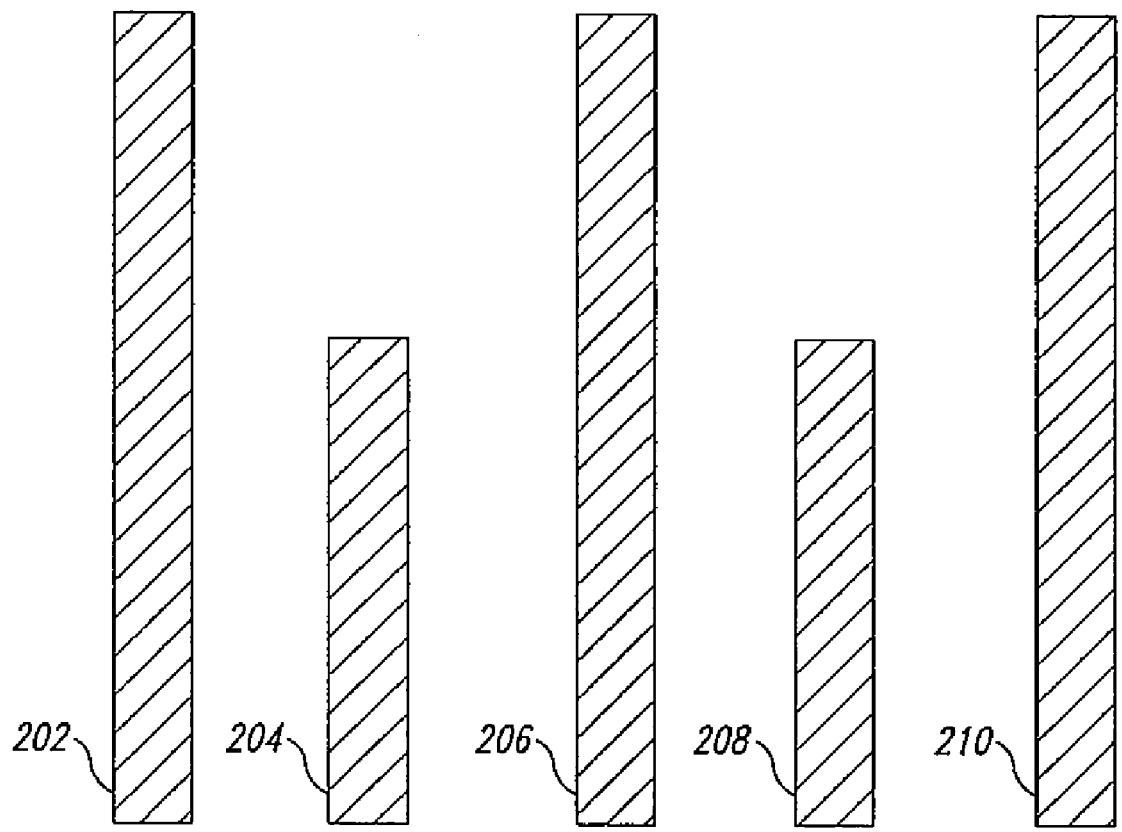
FIG. 3 illustrates a plurality of structures formed of a first metal layer on a substrate for use in making the circuit of FIG. 1A.

FIG. 3 illustrates a plurality of structures 202-210 formed of a conductive layer on a substrate. The conductive layer may be any conductive metal material used during a semiconductor process, but metal is preferred, for example, aluminum. The structures 202-210 of FIG. 3 is a metal layer deposited on the substrate over the polysilicon pattern of FIG. 2 and later processed into the representative shapes shown in FIG. 3. Each structure 202-210 of FIG. 3 represents a connection to one potential location of a resistor, for example Rcritical 104 of FIG. 1A.

Figure 4:
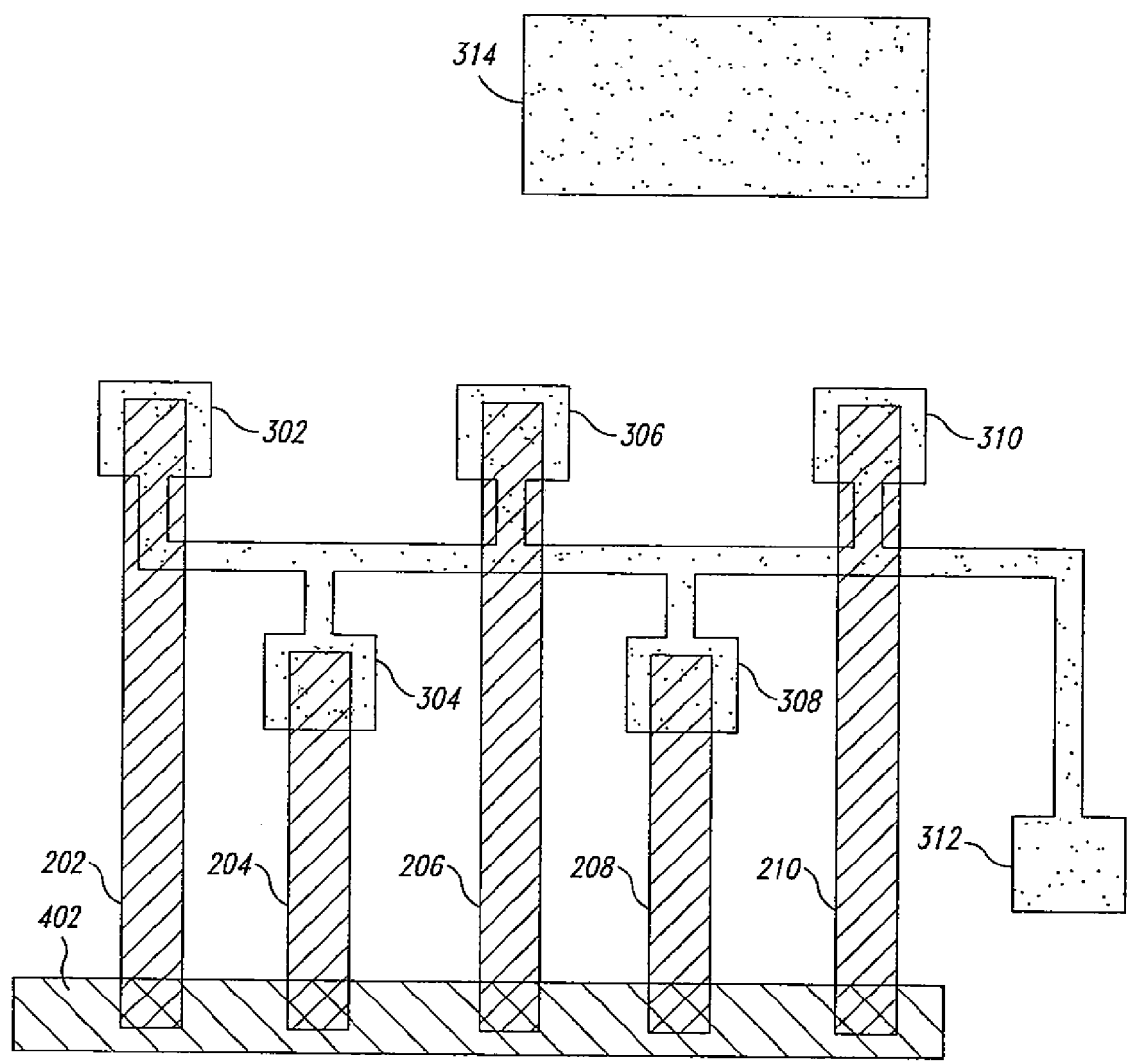
FIG. 4 illustrates a second metal layer structure and the structures of FIGS. 2 and 3 formed on a substrate.

FIG. 4 illustrates a second conductive layer 402 shown in relation to structures 202-210 and 302-314 of FIGS. 2 and 3 formed on a substrate. The second structure 402 may be any conductive layer used during a semiconductor process. The second conductive layer structure 402 may be formed from the same type as the first layer 202-210, or it may be different. The structure 402 of FIG. 4 may be a metal layer deposited on the substrate and later processed into the representative shape shown in FIG. 4. The structure 402 may represent another potential part of a resistor Rcritical 104 of FIG. 1.

Figure 5:
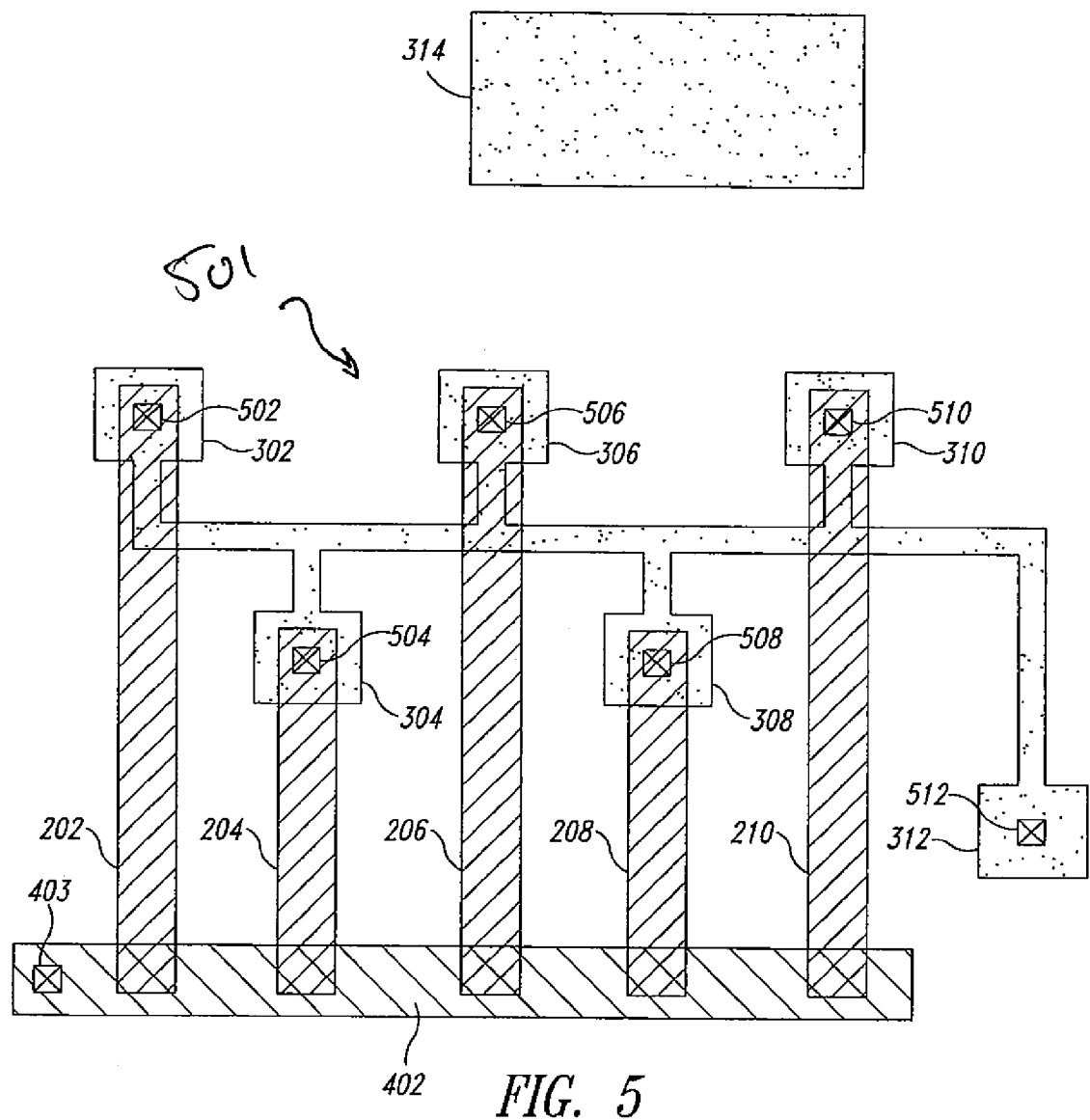
FIG. 5 illustrates a plurality of contacts and the structures of FIG. 4 formed on a substrate.

FIG. 5 illustrates a completed resistive tree 501 which is ready for selecting a final resistance value. The tree 501 has a plurality of vias 502-512 placed on the structures of FIG. 4 formed on a substrate. The vias 502-514 are formed of conductive material and operate to provide an electrical connection between segments 202-210 and 301-310, as is well known in the art. In some cases, the electrical connection of vias 502-514 is to another formed structure. In some cases, the electrical connection of contacts vias 502-514 provides a node that may be used for another purpose, for example, a test point and/or a junction coupled to an external pin. A via 403 is provided on conductor 402 to permit connection of one end of the resistor to other structures.

FIG. 5 further illustrates an exemplary set of structures that may represent one resistor, for example, Rcritical 104 (FIG. 1), which has been partially constructed. For example, a node shown at the contact via 512 may be understood to be a first end of the resistor Rcritical 104, and the second end of the resistor Rcritical 104 may be taken at one or more of the nodes formed by vias 502-510. One of the vias 502-510 may be used for the second end of the resistor Rcritical 104, and then the selection of the second end will select the total resistance of the resistor Rcritical 104. An electrical insulator is positioned between layer 402 and each of the strips in the lower layer, 202-210, unless a via is formed and a conductor placed therein.

FIGS. 6A-6E illustrate the tree 501 having potential configurations of contacts 602-610 that are formed on the substrate. Each one of FIGS. 6A-6E represents one location for a potential via or contact that may be formed with a selected reticle or other mask pattern used in cooperation with a pattern projection system during manufacture of an electronic component in a semiconductor chip. A pattern is selected in correspondence to an electrically defined characteristic that was determined during an earlier manufacturing step. The selected reticle is then used to form the desired additional structures on the substrate, such as a via or contact at a selected location, which provide the target value of a critical value component, for example Rcritical 104.

Figure 6A:
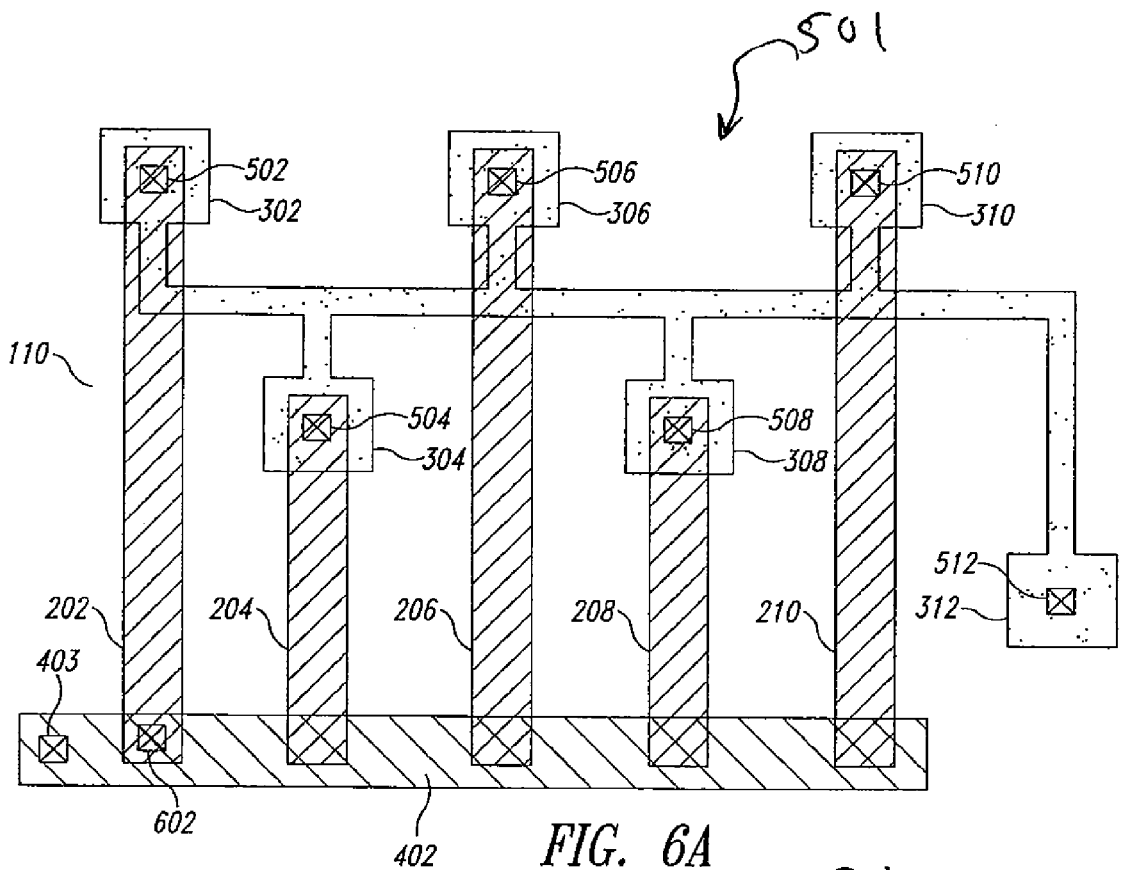
FIGS. 6A-6E illustrate potential configurations of contacts that may be formed on the substrate.
Figure 6B:
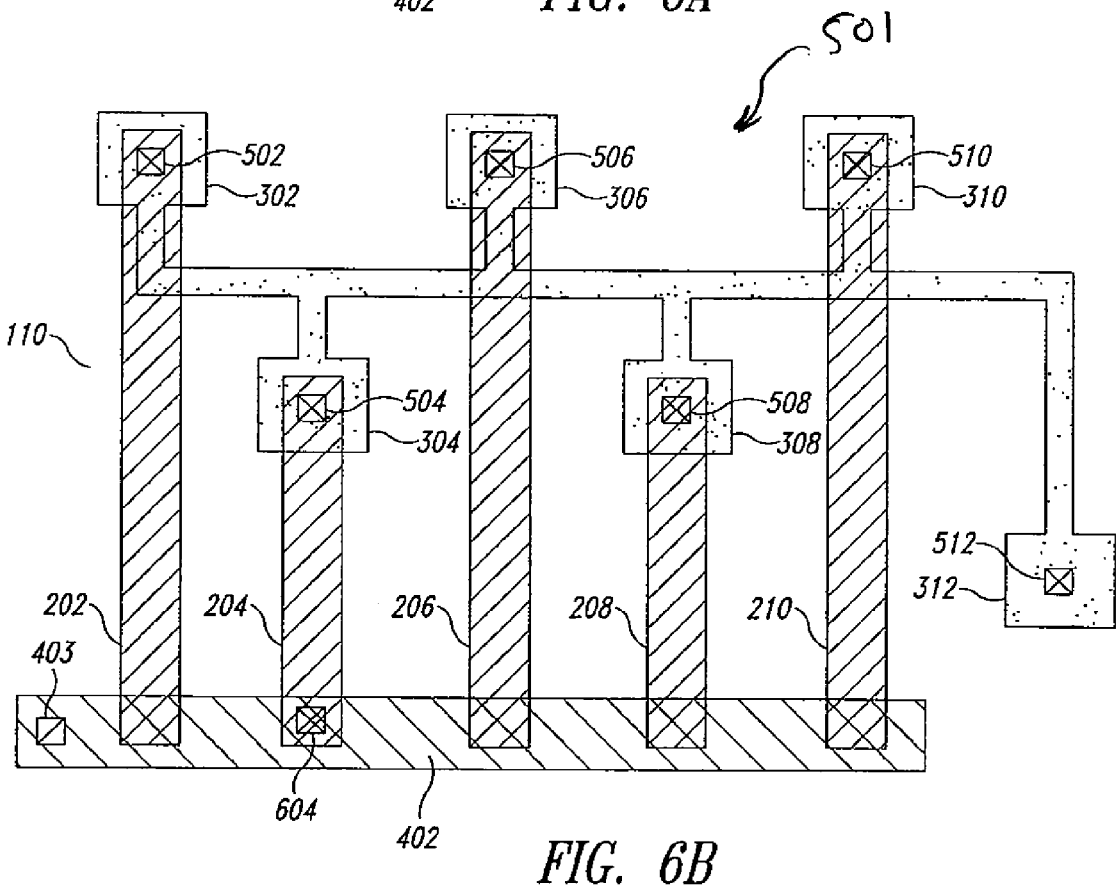
Figure 6C:
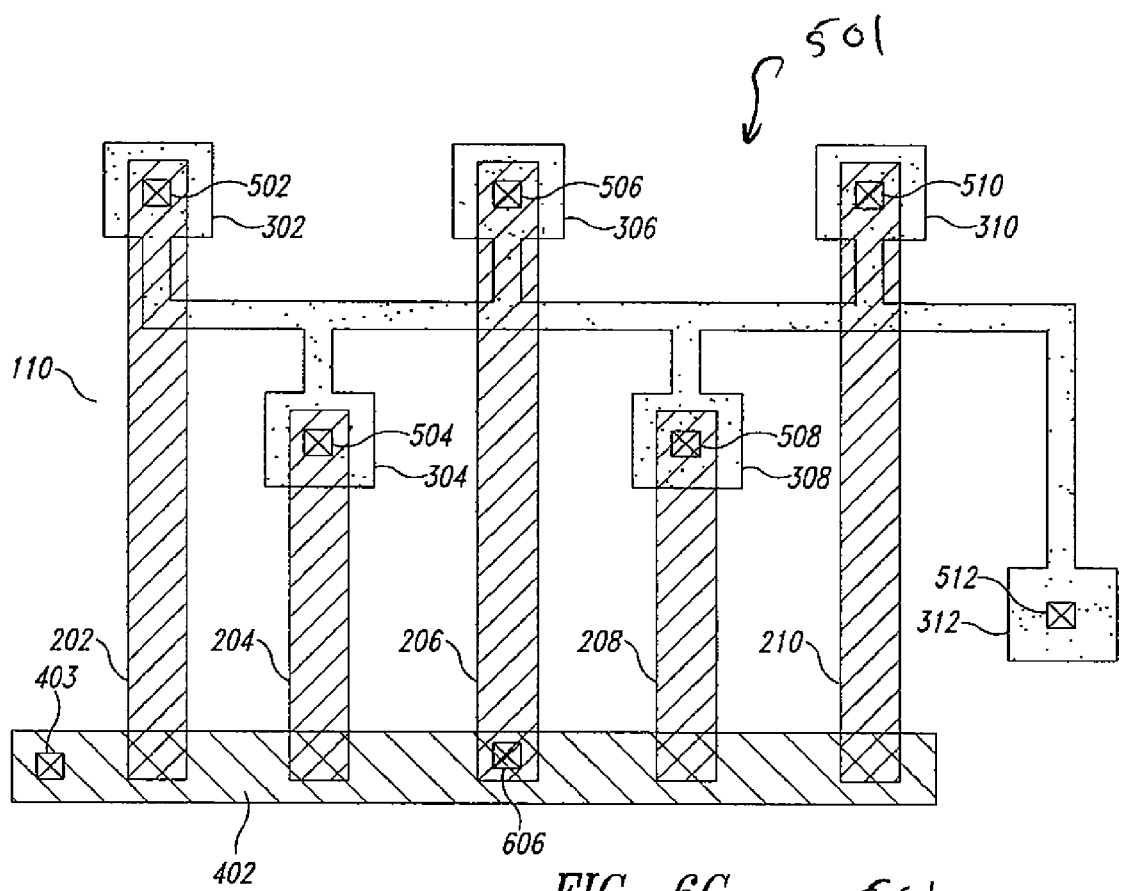

FIG. 6A illustrates an electronic component formed on a substrate, for example a resistor such as Rcritical 104, having the highest possible resistor value. The resistor Rcritical 104 of FIG. 6A is realized by an electrical path having one terminal node at via 512 and another terminal node at via 602. The resistor 104 is formed by resistive segments 301, 303, 305, 307, and 309, together with the path to via 302. The metal strip 402 has a contact 403 to another circuit, not shown, to which the final desired resistor value is provided. The formation of this resistor Rcritical 104 will permit current to flow from contact 512, through the resistive doped polysilicon segments including 301, to contact node 502, through conductor 202, and to the terminal node at contact 602. In the exemplary example of FIG. 6A, the structures 204-210, the contacts 504-510, and some parts of the polysilicon segment structures are not used. They may be considered abandoned. In other words, these formed structures 204-210, 504-510, and 304-310, which were not selected for use in the resistor Rcritical 104, are electrically isolated and do not become part of resistor Rcritical 104.

Figure 6D:
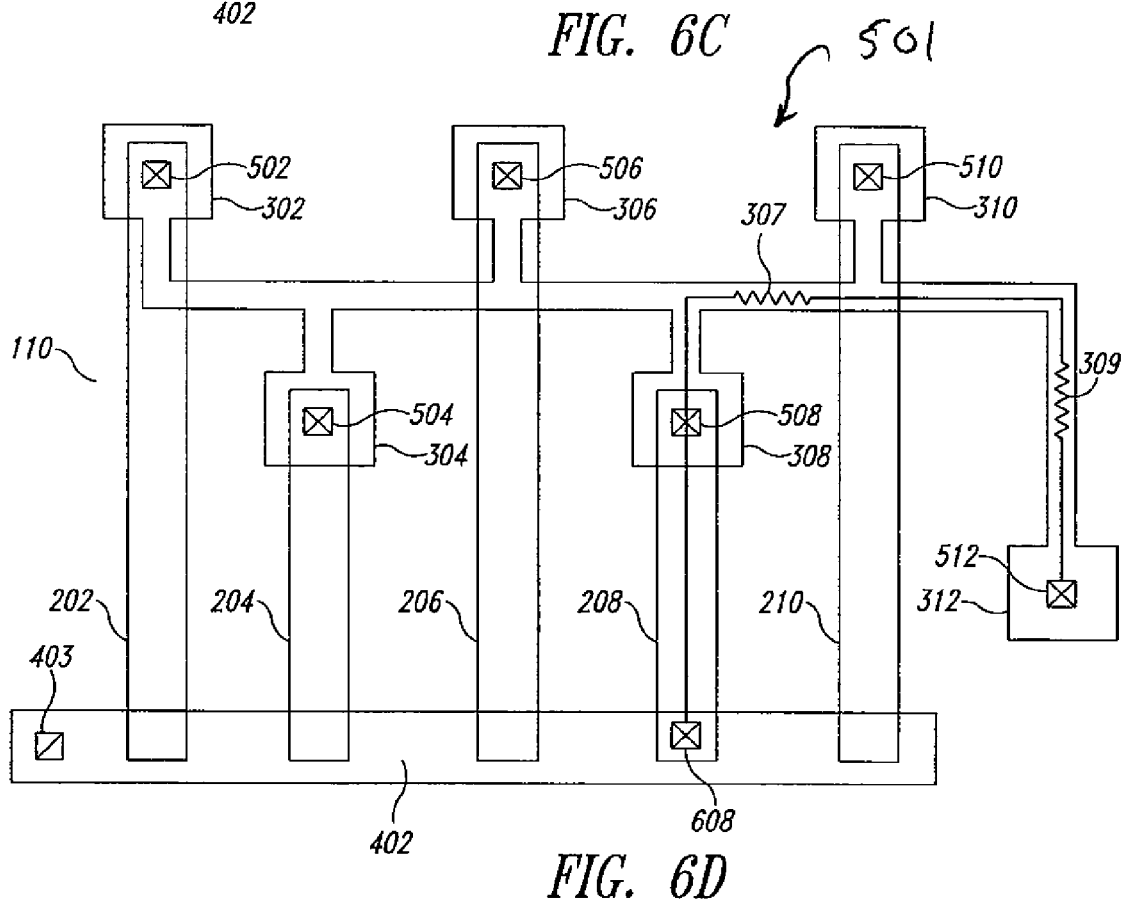
Figure 6E:
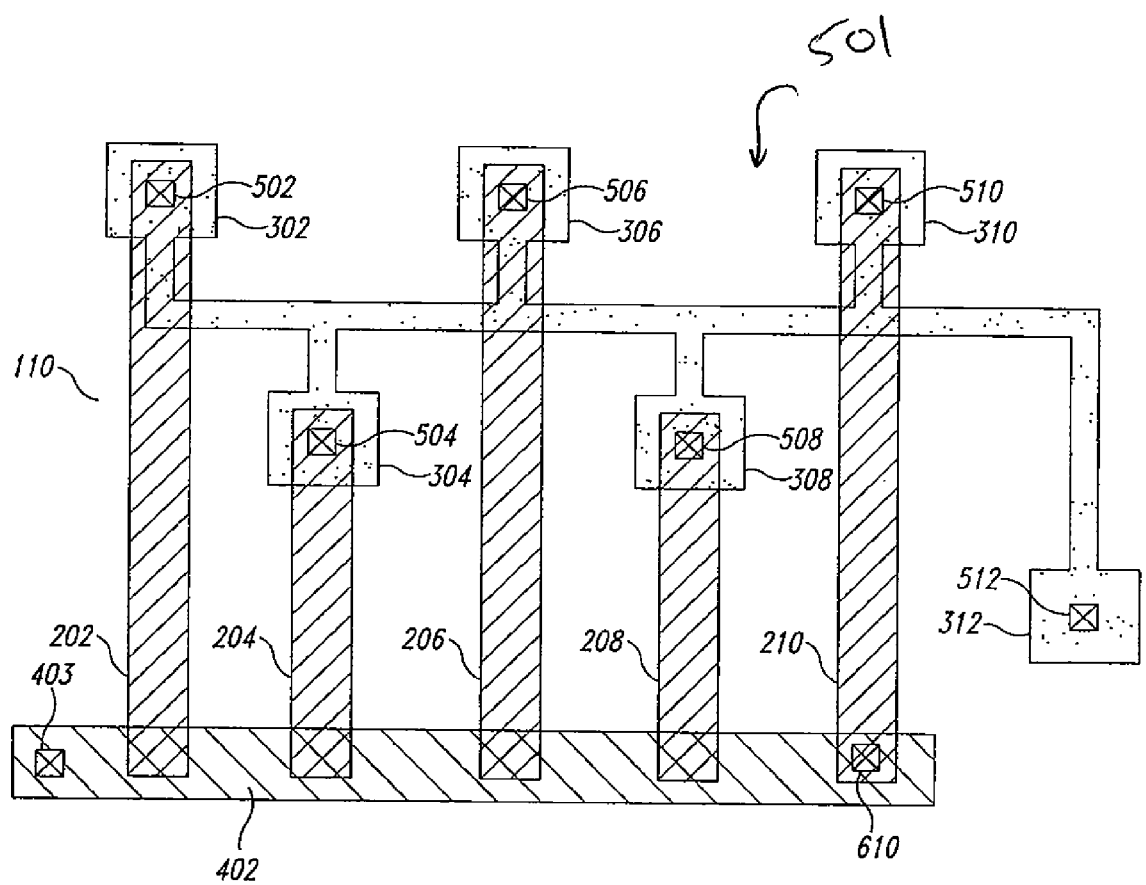

FIGS. 6B-6E may similarly be formed and described as FIG. 6A was described above. The electronic component in each of FIGS. 6B-6E has a first node at contact 512 and a second node at one of the contacts 604-610, respectively. If a lower value resistor is desired, a reticle is selected that will form a contact or via at only location 604. The resistor will have a lower value at output 604 and resistive segment 301 is unused. FIG. 6D illustrates the location of two resistive segments being used, 309 and 307, and other resistive segments are not used if the via is formed at location 600.

If an even lower resistor is desired, then contact at any one of locations 606, 608 or 610 is made, as desired, to achieve a desired final value for resistor 114. Contacts 604 and 606 can also both be made for example, at the same time to form resistors in parallel and an even lower resistance than just one of them being selected. Thus, by selecting various combinations of parallel resistors, a large range of resistance values are available for selection.

During the fabrication process of the exemplary electrical component as shown in FIGS. 6A-6E, a first parameter was measured, the resistivity of polysilicon, then the remainder of the structure was fabricated based on this measurement. When the exemplary electronic component is a resistor, the doping level and polysilicon properties will result in a first parameter, the resistance whose value is not exactly known until it is measured. E.g., the resistance is a first parameter that is less easy to exactly control in the fabrication steps. In the fabrication of other electrical components, one or more different parameters may be identified as having an unacceptable level of variation and as being less easy to control.

Also during the fabrication process of the exemplary electrical component as shown in FIGS. 6A-6E, a second parameter was used as a selection criteria that did offer an acceptable level of control. This second parameter may be considered a controllable parameter. In the exemplary embodiments, several structures were formed where each structure had a different value for the controllable parameter. For example, as shown in FIGS. 6A-6E, the controllable parameter was the length of the resistive segments 301-310, and several structures were formed having different lengths.

Subsequently, when the resulting condition affected by the first parameter is known, then one of the several structures having a particular second parameter is selected for fabrication into the final electronic component. In this case illustrated in FIGS. 6A-6E, after measuring, calculating, and or observing resistivity of the polysilicon, one or more of the resistive segments 302-310 was selected for fabrication into the final resistor Rcritical 104. There are many techniques to measure the resistance of polysilicon and some processes in use today measure the sheet resistance of the doped polysilicon as part of the already standard process. Use is made of that measurement to select a pattern in the reticle that will result in constructing a circuit having the desired electrical characteristics. A series of reticles are prepared in advance, each one having a contact at the different locations of FIGS. 6A-6E. After the value of the desired resistor is known, that reticle which will provide the desired resistance value for circuit performance is selected and used for the next step in fabrication of the circuit.

The selection can be made by computer program or other techniques using the sensed or measured values. As one example, the length of the various resistor segments 301-310 is provided into a table or computer database. These will be known from the layout mask. Further, a target final resistance will also be known from the design specification when the circuit was designed, which is also provided in the computer database. After the polysilicon layer of the resistor is formed, the value of the resistivity is sensed and measured, such as by a spreading 4-point probe. This measured value is then input to the computer database. Using the stored data and input data, the computer can easily calculate which of the via locations 602-610 or combinations thereof will result in the resistance value that is the closest to the precise design value needed. The pattern to achieve this via combination is then produced on the wafer, using the results of the calculation.

In summary, according to the embodiment described herein, a parameter is measured after a portion of the integrated circuit has been completed. For example, it may be measured after metal one has been formed, after polysilicon has been formed, but before the forming of metal one, after doping the substrate and before formation of polysilicon or at various other steps in the semiconductor process. A plurality of post measurement mask options are created, for example, a plurality of different via masks.

Subsequently, a specific mask from the options available is then selected depending on the results of the early measured values.

For example, in a first embodiment, an optional mask set for each wafer is determined, then during manufacture on a wafer-by-wafer basis and the appropriate mask or reticle is loaded into the pattern generation machine using a recipe loading system computer at the exposure step. The particular option may require up to four or five extra masks in the initial setup, which each have a cost associated therewith. However, since the pattern exposure tools in use today include computer control capabilities for selection and mounting of masks and are controlled by complex microprocessors, there is no additional hardware overhead and this merely requires the implementation of software code and various data into memory tables at different times in the process. Accordingly, the overall extra cost per wafer is quite low, in the range of a few dollars per wafer. If hundreds of chips are being made on a single wafer and the same mask set is repeatedly used from wafer to wafer, then the additional cost is negligible, yet as a result very high quality components which are assured of being within exact tolerances are repeatedly reliably made in each chip.

Alternatively, instead of creating different masks and different mask options, a different method may be used to create a different pattern on the substrate. According to an alternative embodiment, a single reticle or mask may be used at the custom structure step. The stepper equipment will align the mask or reticle at differently in order to form the structure at the desired location. For example, the reticle may be moved in an X or Y direction from wafer to wafer or from chip to chip in order to form the via at one of the selected locations as shown in FIGS. 6A-6D. Since the potential locations for the desired contact are all closely adjacent each other and are spaced apart by a known distance, usually in just one direction, an offset of a small amount, such as 1 micron, in just one direction, will align the reticle to form the contact for a different resistance value. Therefore, once the desired resistance value is known, the reticle is moved the appropriate distance offset from the center to either the left or right along the X axis in order to form a resistance of the desired value. If the preset location is the middle resistor, than movement one or two steps in either direction will produce the desired range of available contacts. According to this alternative embodiment, no additional reticles are required and the pattern projection system is able to form the pattern at the desired location without the need for additional reticles. Thus, according to this solution there is no additional cost or hardware required, but merely a software code program which contains the respective data and receives the measured value and then aligns the reticle at the appropriate X, Y location to produce the desired pattern.

According to one embodiment, a software program is provided to provide the correct reticle for the particular step in the process of making the chip. In one embodiment, an indication of the desired resistive value is input to the software. Previously, a memory of the control system of the exposure and reticle system has had stored therein the particular reticle arrangement that will achieve each of the possible resistance values. The control computer for the exposure and reticle system will check the memory table to obtain the a listing of the available reticles and select that contact location which will obtain the closest value to the desired resistance. This can be done by selecting one of reticle from a set of reticles, or by moving the current reticle to a particular offset location to obtain the desired resistance value.

In the examples shown, a single mask option has been shown as an example. In this example, the via coupling between metal one and metal two is the optional mask which is selected based on the parametrical measurement results. Thus, the via mask has been used for trimming the value of the component. A different mask, such as via 2 or M3 may be used instead of, or in addition to, a via between M1 and M2 in order to trim or, in other words, selectively control the formation of an electrical circuit having a desired tolerance level.

In summary, the embodiments described herein are for products which are manufacturable for very tight product specifications and can consistently reproduce the circuit at a very low cost. This technology offers a setup time which is much shorter in process from one circuit to the next and repeated computer analysis of the first series of wafers will reduce the number of wafers that need a correction and, fewer reticles may be needed in order to be assured of reaching the desired value.

In some publications, vias are referred to as contacts, and contacts as vias and the term via, as used herein, is intended to be sufficiently broad as to include an electrical connection between two layers of semiconductor material, including from metal one to polysilicon, polysilicon to substrate, metal one to substrate or other various combinations.

Figure 7A:
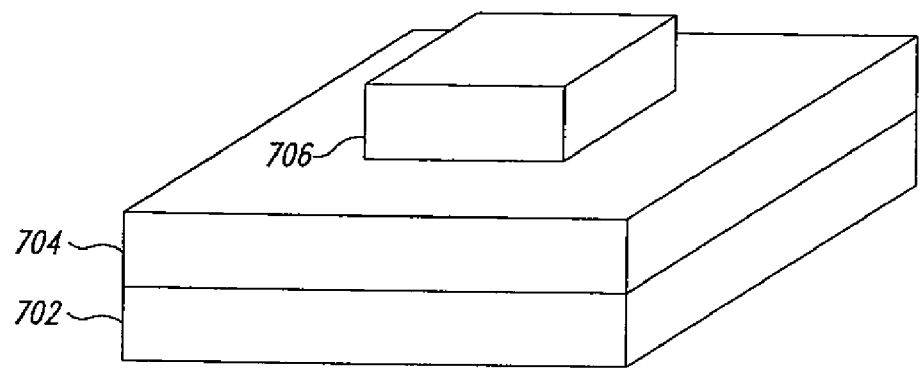
FIGS. 7A-7C illustrate the potential configurations of two conductive plates separated by a dielectric layer.
Figure 7B:
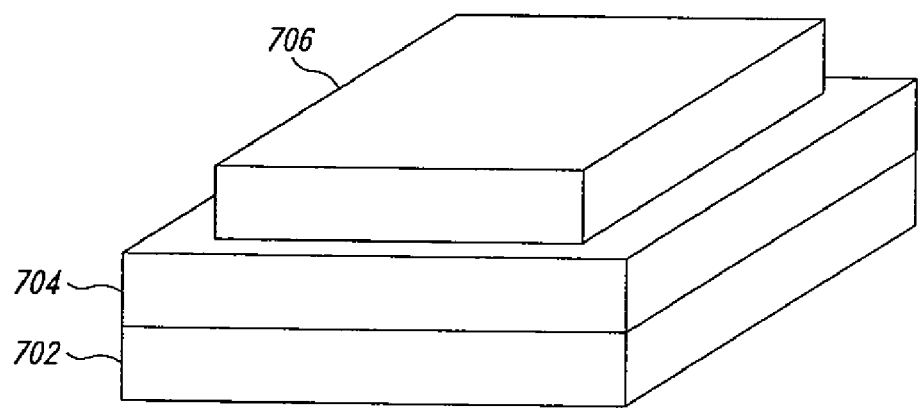
Figure 7C:
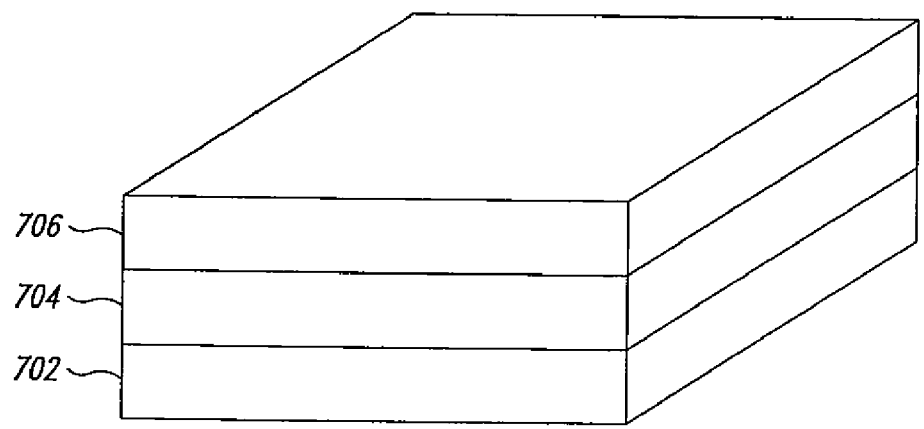

FIGS. 7A-7C illustrate the potential configurations of two conductive plates separated by a dielectric layer. Each of embodiments of FIGS. 7A-7C represent functional parts of a capacitor, for example Ccritical 116 (FIG. 1B). A typical capacitor may be comprised of two conductive surfaces separated by a non-conductive dielectric region.

The conductive plates of a capacitor may be formed by any material having desirable conductive properties. For example, exemplary materials for the formation of a conductive plate may include polysilicon, metals, conductive metal oxides, and/or any other materials.

The dielectric of a capacitor may often be formed by any material having a suitably high dielectric constant and a suitably low leakage current property. In some cases, exemplary dielectric materials include compositions of silicon and oxygen and/or silicon and nitrogen.

Each of the structures of a capacitor may be formed with dimensions that affect the overall capacitance of the electronic component. Storage capacity, or capacitance, of a structure is typically measured in farads, and the capacitance of the structure follows a generally known formula:

$$C = \frac{kA}{d}$$

wherein
k=dielectric constant
A=area of the conductive plates
d=distance between the conductive plates As evident from the capacitance formula, the total capacitance is affected by the area of overlap of the two conductive plates, the distance between the plates, and the properties of the dielectric material having a dielectric in constant k. With respect to FIGS. 7A-7C, the capacitance of the overall structure is affected by the area of overlap of conductive layers 702 and 708, the thickness of dielectric layer 704, and the dielectric characteristics of dielectric layer 704.

In certain exemplary embodiments, the capacitance value of a particular electronic component may be critical. For example, Ccritical 116 (FIG. 1) may be a capacitor used to tune circuit 112 and will have desired properties only if the capacitor Ccritical 116 is within a predetermined range of values. At one precise value of the capacitor, the circuit will have a very high quality or Q factor The structures shown in FIGS. 7A-7C illustrate one method of assuring that the capacitance of capacitor Ccritical 116 is within the desired range to a tight tolerance. In one embodiment, after the formation of first plate 702 and dielectric 704, a measurable electrical characteristic or other electrically defined property of one or more of the structures 702, 704 is determined. In the example shown, plate 702 is formed a selected size. The dielectric layer 704 is then formed. A property of the dielectric layer, either thickness d, or dielectric constant k, or some other property is measured. After this measurement is made, the exact capacitance value can be easily fabricated by selecting the area of the top plate 706. The measured values of d and k are input to a computer program and, given an exact target value of C, the area A is calculated and output.

If a smaller capacitor is desired, the top plate 706 is made smaller, as in FIG. 7A. If a larger capacitor is desired, it is made larger, as in FIG. 7B. A series of reticles are provided in advance that each have the different size upper plates. After the properties of dielectric layer 704 are known, the reticle having the size for the formations of the correct capacitance value is selected and used to complete the capacitor.

Subsequently to forming layer 704, the dimensional size and/or positioning of layer 706 is constructed in correspondence to the measurable characteristics such that an overall capacitance of capacitor Ccritical 116 is suitably achieved. In some cases, the conductive layer 706 may be formed to an actual dimension that is less than a maximum potential dimension. As illustrated in FIGS. 7A, 7B, for example, the actual dimensions of layer 706 has been formed to a size in correspondence to less than the maximum possible in the properties of layer 704, and/or some other measurable characteristic.

Figure 8:
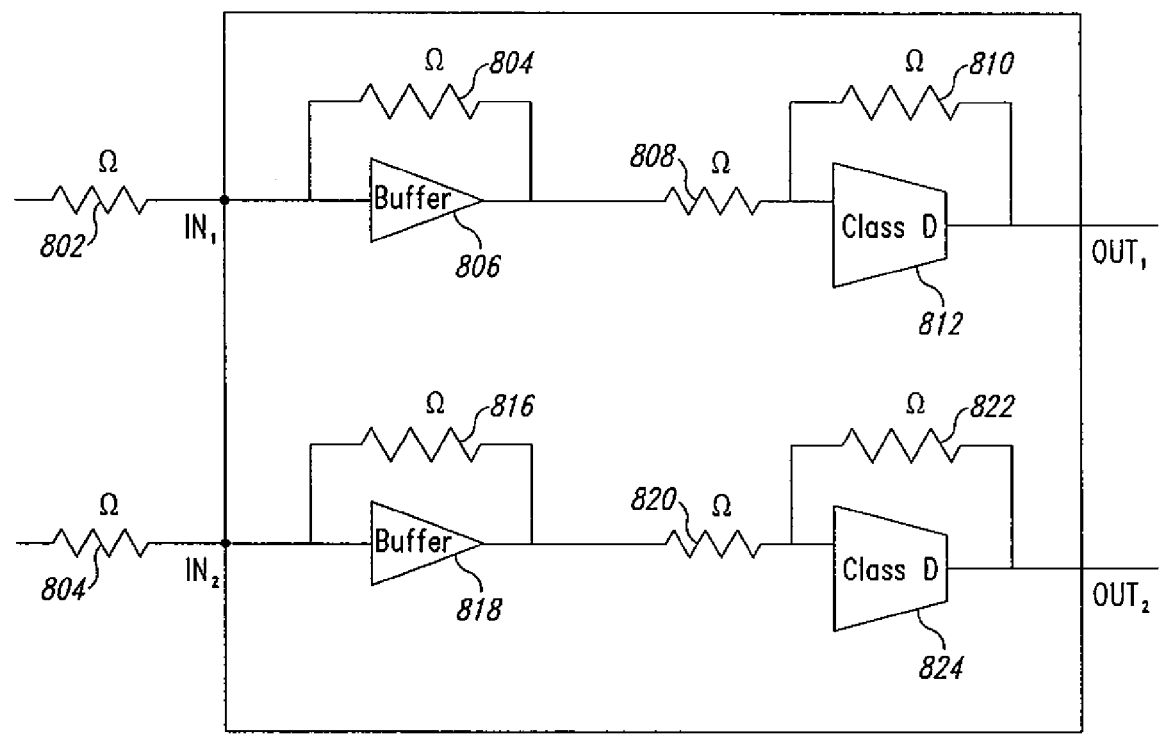
FIG. 8 illustrates an exemplary embodiment of a dual channel amplifier.

FIG. 8 illustrates an exemplary embodiment of a dual channel amplifier. In a first channel, an attenuation resistor 802 may condition a signal for input to the amplifier at node IN1. The input signal may be further conditioned with a buffer 806, which may be operatively controlled with a feedback resistor 804. The properly conditioned signal emanating from buffer 806 may be subsequently passed into a class D amplifier stage, which may comprise a resistive voltage divider network of resistors 808 and 810 and a class D amplifier circuit 812. In some embodiments, it may be desirable to control the overall resistance value of resistor 808, because resistor 808 may also control the feedback, and thus the overall performance, of the class D amplifier circuit 812.

The second channel of the exemplary dual channel amplifier of FIG. 8 may operate in a manner similar to the first channel. An attenuation resistor 814 may condition a signal for input to the amplifier at node IN2. The input signal may be further conditioned with a buffer 818, which may be operatively controlled with a feedback resistor 816. The properly conditioned signal emanating from buffer 818 may be subsequently passed into a class D amplifier stage, which comprises a resistive voltage divider network of resistors 820 and 822 and a class D amplifier circuit 824. In some embodiments, it may be desirable to control the overall resistance value of resistor 820, because resistor 820 also controls the feedback, and thus the overall performance, of the class D amplifier circuit 824.

A common circumstance may occur when an electronic engineer designs a circuit, and a fabrication engineer creates the process to build the circuit onto a chip. In such cases, the electronic engineer often provides a schematic or other documentation to the fabrication engineer, which often includes tolerance ranges for each component. The fabrication engineer then may choose a process capable of producing components within the specified tolerance ranges. If each component is constructed to a value within its tolerance range, the circuit may be expected to achieve a known operational quality.

When making a chip, a variety of manufacturing processes are often used to fabricate the electronic components onto the semiconductor substrate. The processes may include photolithographic, chemical, environmental, and other steps during which individual elements of the electronic components are formed. The manufacturing processes used, however, may affect the manufacturer's ability to control certain parameters during chip fabrication, and thus may affect the operation quality of the circuit. The limited control of certain parameters may produce a variation in the quality of the formed electronic components. Accordingly, if certain parameters are not well controlled, then some components may not be formed within tolerance ranges necessary to achieve the expected operational quality of the circuit. In these cases, some or all of the manufactured chips may have reduced value or may have no value at all.

According to current methods, all wafers in a set are manufactured using the same masks. After the fabrication is complete, the circuits are tested and sorted. Those circuits with superior performance are sold at a higher price, those circuits which operate at a lower performance are sold at a lower price, and those which do not operate are discarded. In some prior art systems, duplicate or redundant circuits are put on the chip when it is fabricated. During the testing phase, if some part of the circuit does not operate correctly then the inoperative circuit components are blocked out, such as by a fuse, and the duplicate or redundant components are substituted for them, so that the chip as a whole operates. All this testing and repair is done in the prior art after the wafer is fabricated.

However, according to one embodiment of this invention, some testing is done on some structures in the circuit after part of it is fabricated on the wafer, but before the circuit on the wafer is fully formed and the wafer finished. Subsequent fabrication steps for the wafer after the testing can be modified or customized to fabricate a circuit that is more likely to be operational and also will operate at a high quality level, whether faster, greater gains, higher Q factor, or other characteristic. Changes made at later steps include different mask patterns, doping levels, additional layers, different dielectric isolation, different materials, or the like. Such changes are made based on the result of measurements taken after some steps of fabrication, but before final fabrication.

For example, in FIG. 1A, the feedback resistor Rcritical 104 has substantial control over the gain of the Class D amplifier. If the preferred specifications for the circuit are to be achieved within a tight tolerance range, then the value of Rcritical 104 will need to be formed within a tight tolerance range.

In the formation of a resistor on a substrate, it has been observed that the resistivity of the polysilicon is a parameter that is less controllable than other parameters. That is, in some circumstances, even when care may be taken during the fabrication process to tightly control each aspect of the doping of polysilicon, the fabrication of each different wafer may produce resistors with different resistivity. Accordingly, if several structures are formed wherein one controllable parameter, length for example, is different for each structure, then the variability of the less controllable parameter, resistivity for example, may be compensated for.

Stated another way, and with respect to the construction of a resistor, it is noted that the length of a resistive segment is a parameter that is controllable with substantial accuracy. On the other hand, the resistivity, or ohms per square unit, of a resistive segment is a parameter that is less controllable. Accordingly, for electrical components that require critical values, several potential structures or circuit sites may be developed. Subsequently, after a particular measurement is taken and/or other value is determined, one or more of the potential structures or circuit sites may be further fabricated into an electronic component, and the other structures or sites may be abandoned or remain electrically insulated from the rest of the circuit components.

The illustrations of FIGS. 2-12 show many structures of different materials as may be formed on a substrate. As illustrated, the structures may overlay each other in some areas and not in others. Additionally or alternatively, the illustrations also provide examples of how several structures may be combined to form an individual electronic component. In some instances, overlapping structures are electrically connected, and in other instances, overlapping structures are electrically insulated.

The illustrations of FIGS. 2-7E show resistive and capacitive electronic components, but other electronic components may also be formed. For example, in some instances, the electronic component may be a resistor and/or a capacitor, but in other instances, the electronic component may also be an inductor, a switch, a diode, a transistor, a control device (for example a device that acts according to temperature, humidity, and/or the like), a transducer, or any other suitable electronic component. Some of these examples are shown in FIGS. 9-12.

Figure 9:
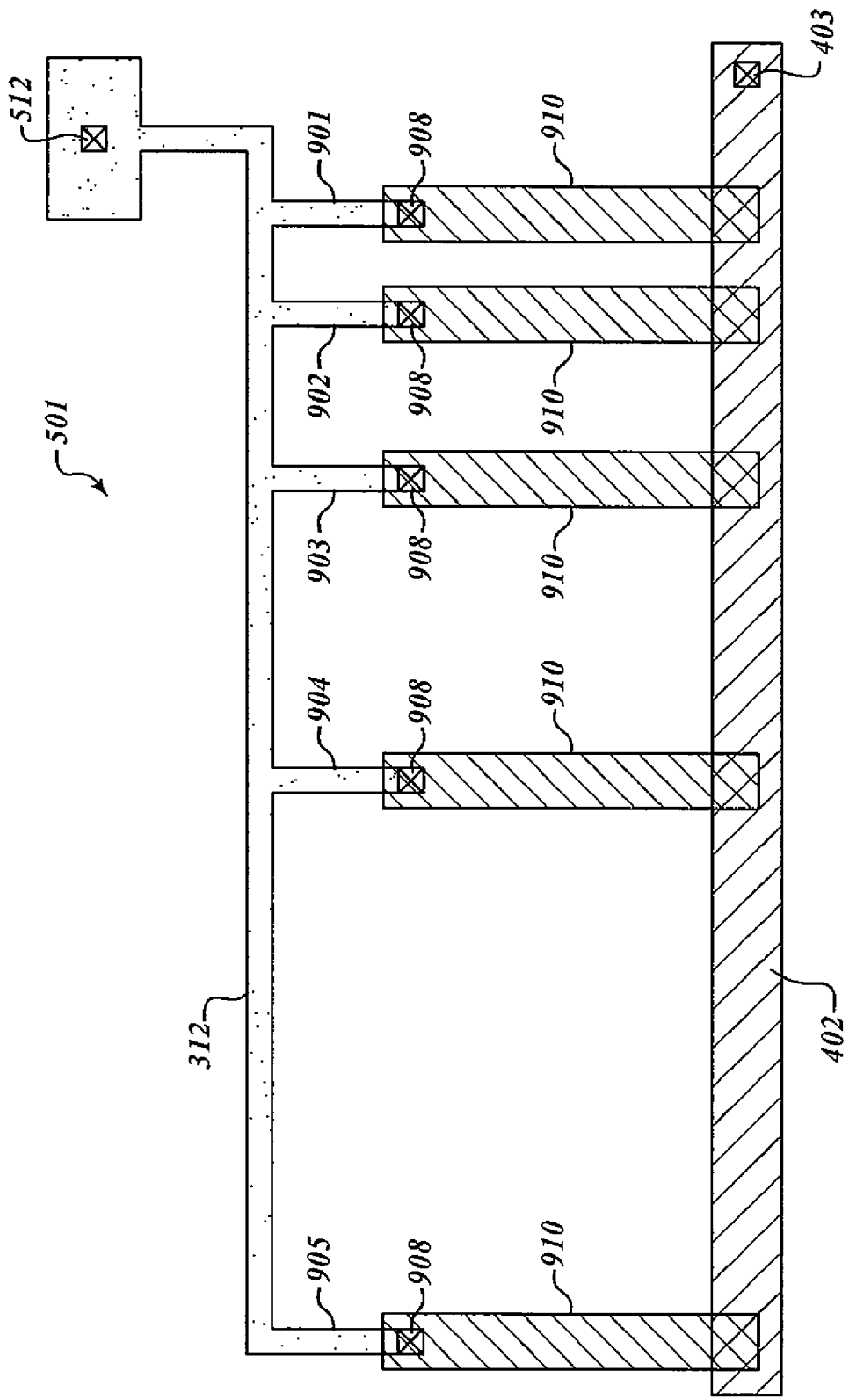
FIG. 9 illustrates an alternative embodiment of resistor segments having different lengths.

FIG. 9 illustrates an alternative layout design to that shown in FIGS. 2-5.

The resistive tree 501 includes a plurality of connective strips 910 which are highly conductive and do not appreciably change the resistance of the circuit, similar to strips 202-210 of FIG. 5. The strips 910 have the same length for each of the resistive taps 901-905. Each of the conductive strips are coupled by respective electrical contact 908 to the resistive tap of the polysilicon strip 312.

The general concepts in operating specifics of FIG. 9 are similar in many respects to that of FIGS. 2-5 and the details will, therefore, not be repeated. Similar to FIGS. 2-5, a polysilicon structure 312 is included having a contact 512 thereon for connection to other circuits. A second conductive layer 402 is used for coupling to another section of the working circuit. In the embodiment of FIG. 9, a plurality of resistive taps 901-905 are provided, each having a different resistive value. The resistive value is determine based on the current path between the electrical contact 512 and the contact 403. This is via the connecting strip 910, which is coupled to each of the respective resistors 901-905 by electrical contacts 908.

Each of the conductive strips 910 overlays the conductive structure 402 in a location that permits electrical contact. After the value of the poly strip resistivity has been tested to determine the value, the appropriate final contacts are made between the resistive layer 312 and the conductive layer 402 by completing the contact to the desired conductive strips 910 to the conductive layer 402 to form the final resistive network tree 501. This is performed the same way as previously described with respect to FIGS. 6A-6E.

According to the embodiment of FIG. 9, each of the resistors has a value which is different from the others by set ratio of variable amounts in the resistive tree 501. The first resistor 901 has a selected value. The next resistor 902 has an increased resistance value of n above that of 901. The next resistive tap 903 has an increased resistance value of 2n above tap 902. The next resistive tap 904 has an increased resistive value 4n above that of 903. The next resistive tap 905 has a resistive value 8n above tap 904. Accordingly, a wide variety of choices are provided for selecting a final resistive value. For a maximum resistive value, only the resistive tap at 905 will be coupled. For a minimum resistive value, all of the resistive taps 901-905 will be coupled in parallel via respective electrical contacts to the conductive layer 402. If an intermediate resistive level is desired, respective combinations of the resistive taps 901-905 can be coupled. For example, resistive taps 902 and 904 can be coupled to achieve a desired resistive value less than tap 902 alone, but above tap 901. Alternatively, resistive taps 901 and 904 can be coupled to achieve a different resistive of a known value. A plurality of resistive trees 501 similar to that shown in FIG. 9 can be provided on a single semiconductor chip. When it is desired to closely match resistive values or certain ratios of resistive values, the electrical contact locations to couple the conductive strip 910 to the conductive layer 402 can be selected to provided the most closely matched resistive values according to the desired operation of the circuit.

Figure 10:
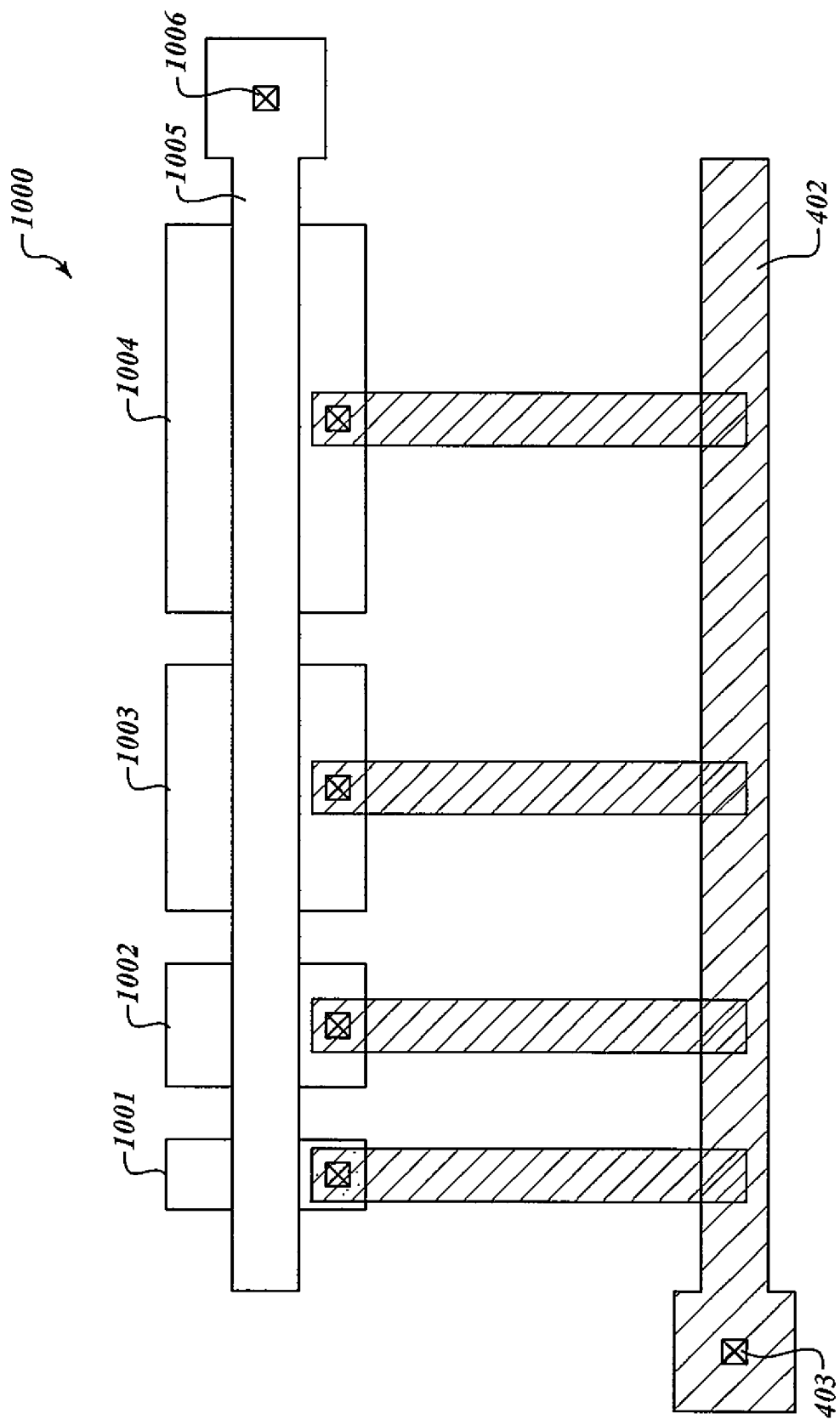
FIG. 10 is a schematic of a plurality of transistors having different length to width ratios.

FIG. 10 illustrates a transistor tree 1000 having a plurality of different transistors 1001-1004 each having different length to width ratios. A common polysilicon gate 1005 is provided for each of the transistors 1001-1004.

Each of the transistors in the transistor tree 1000 has a different length to width ratio and therefore different operating characteristics. The operating characteristics may vary according to speed, current carrying capability, temperature coefficients or other factors. In the example given, the length to width ratio is the only physical factor which is shown as being varied between the transistors. Alternatively, a number of other characteristics could be varied between transistors in the same semiconductor substrate. For example, the threshold voltage could be slightly modified in each of the transistors in the transistor tree 1000. Alternatively, the doping profile of the source to drain regions may be modified slightly. As a further alternative, different operating characteristic parameters of the transistors may be varied for each of the transistors 1001-1004 so as to obtain a group of transistors having slightly different operating characteristics from each other.

A conductive layer 402 is provided similar to that provided in the prior figures to which each of the transistors 1001-1004 may potentially be connected. After the circuit has been partially formed, the different operating characteristics of the circuit to which the transistors 1001-1004 are to be connected is tested and measured. Alternatively, the operating characteristics of transistors 1001-1004, or test structures which replicate their characteristics, are measured. After such measurements, it is determined which of the transistors 1001-1004 will provide the highest quality performance in the end circuit. After such determination is made, one of the transistors 1001-1004 is electrically coupled to the conductive layer structure 402 and the remaining transistors are unused using the techniques previously described with respect to the prior embodiments. The appropriate electrical contact is made to the contact 1006 on the polysilicon gate 1005 in order to provide proper operation of the electrical circuit.

Figure 11:
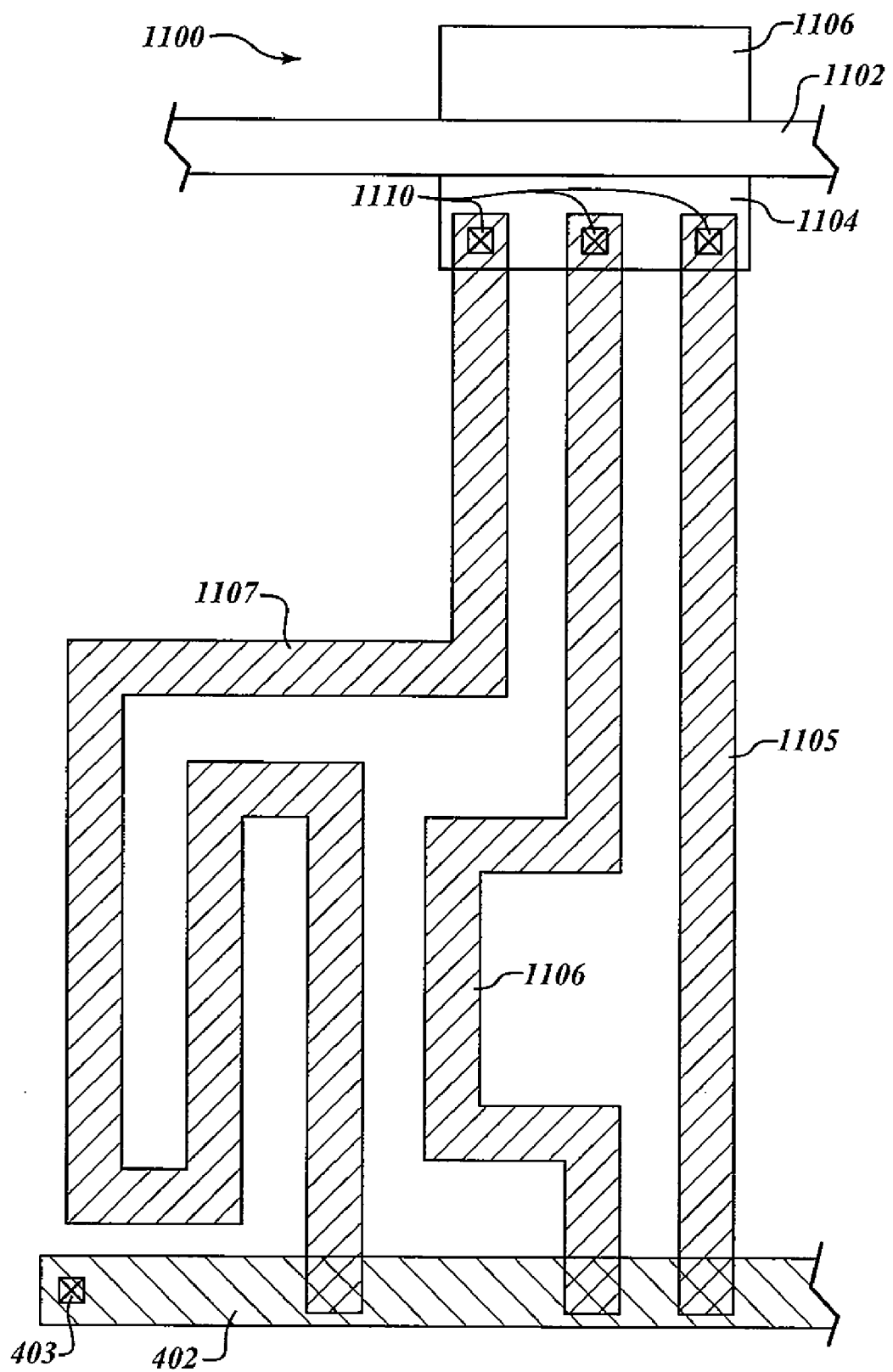
FIG. 11 is a schematic of connection lines having different signal propagation times.

FIG. 11 illustrates yet a different type of electrical circuit which may be used in an alternative embodiment in the present invention. According to this embodiment, a conductive layer structure 402 is provided having electrical contact 403 which is to be coupled to an operational circuit in the same semiconductor substrate. Another electrical component 1100 is provided as part of the circuit. The component 1100 may be a transistor, as shown, or a diode contact, resistor, or other component. A plurality of electrical connection lines 1105-1107 are made between the component 1100 and the conductive layer structure 402. Each of these is electrically coupled by a respective contact 1110 which, in one embodiment is separate for each of the connection lines, and in another embodiment is a common electrical connection in order to save space on the integrated circuit and provide a smaller drain region 1104. When a common electrical connection 1110 is used for each of the coupling lines 1105-1107 they will merge into a single central electrical contract location 1110 and only one contact will be present at the component 1100. Each of the connection lines 1105-1107 has a slightly different length. The different length can be obtained by various shapes of different serpentine paths, examples of which are shown in FIG. 11.

In some circuits, the propagation time for which a signal is delivered from a particular transistor to another part of the circuit is critical for high quality circuit operation. It is known in the art to provide one or more inverters in a circuit in order to vary the amount of the delay from one part of the circuit to another part. However, such inverter chains will always have at least the difference in a gate switching time between the options of having one additional inverter in or out of the transmission chain. It may, therefore, be difficult to customize a difference in signal propagation time which is very slight, on the order of picoseconds or femtoseconds or less. Such a small difference in the propagation of a signal can be obtained by making minor differences in the length of signal propagation lines. Propagation line 1106 may be, for example, 25% or 100% longer than propagation line 1105. Propagation line 1107 may be another 40% longer and thus add another propagation delay option carrying a signal from component 1100 to line 402. Only three examples of propagation lines 1105-1007 are provided, but of course a plurality of many different propagation lines can be provided, each having a slightly different length to vary slightly. The slight differences in length provide for very small differences in the propagation time of a signal between one part of the integrated circuit to another part of the integrated circuit.

After the integrated circuit has been partially built and tested, the preferred time for propagation of the signal from component 1100 to conductive layer 402 can be determined. The conductive path which most closely matches the desired propagation time can therefore be selected in order to provide the highest quality performance of the electrical circuit.

Figure 12:
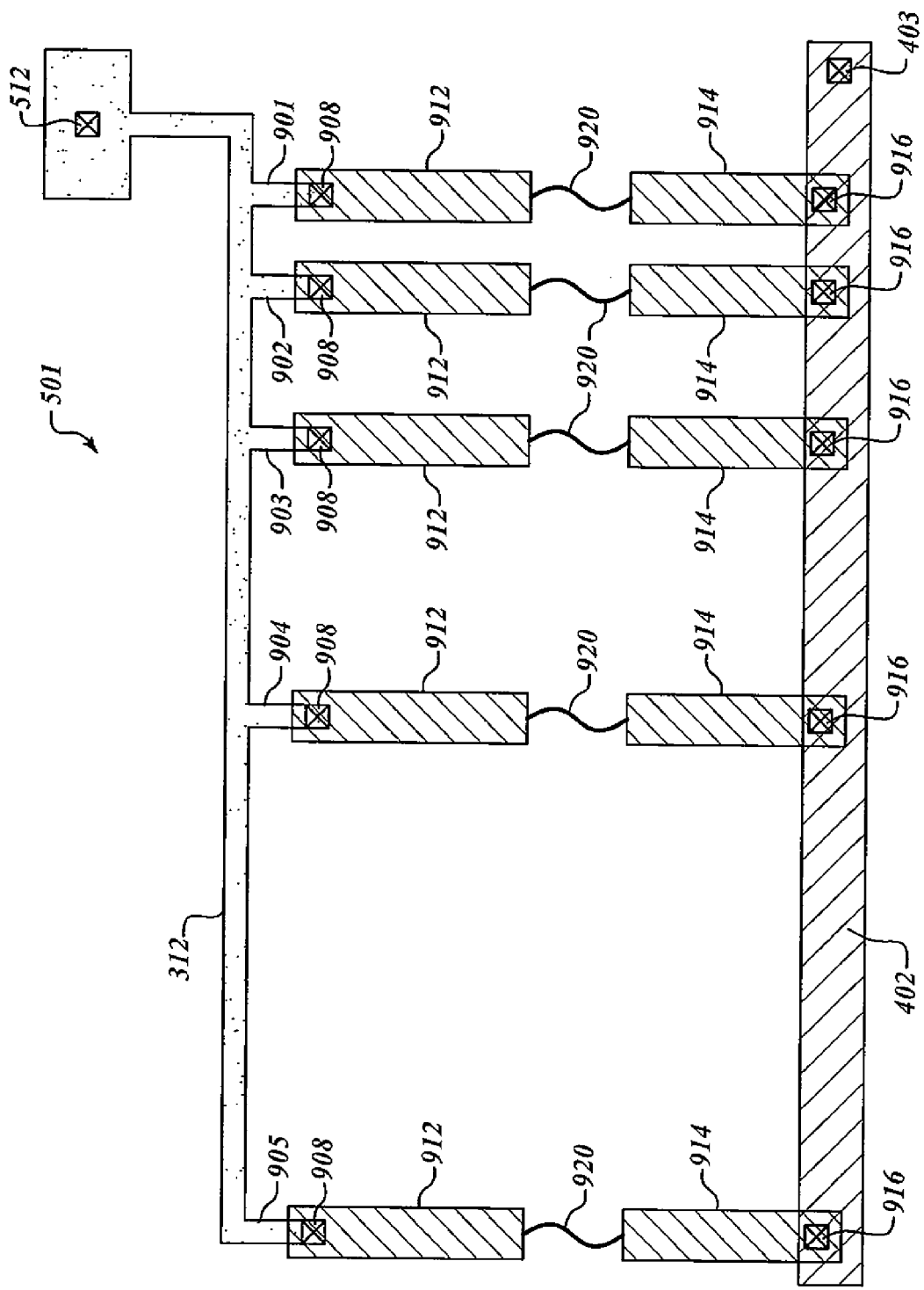
FIG. 12 is a schematic of a further alternative embodiment of the present invention.

FIG. 12 illustrates yet a further alternative embodiment of that shown in FIGS. 2-5 and FIG. 9. The alternative embodiment of FIG. 12 is similar in many respects to that of FIGS. 2-5 and 9. Accordingly, only the differences between FIGS. 2-5 and 9 will be discussed.

According to the alternative embodiment of FIG. 12, the resistive tree 501 is provided with a plurality of resistors 901-905 of different lengths as set forth in FIG. 9. In this embodiment, conductive strips 912, 914 are coupled by the respective electrical contacts 908, 916 between the resistive strip 312 and the highly conductive strip 402. A fuse 920 is coupled between each of the respective conductive strips 912, 914. The fuse 920 is present and provided on all resistors 901-905 when the circuit is originally formed. The circuit is completed and connected to be operational by connecting the appropriate electrical contacts to contacts 403 and 512 when the integrated circuit is completed. After the integrated circuit has been completed and is tested, the final value of the resistance between the electrical contact 403 and 512 can be selected and the appropriate fuses 920 blown to leave only those connections which are desired to form the target electrical resistance value. When the fuse 920 is blown, the remaining structure, whether air, glass, or a vacuum, becomes an electrical insulator between adjacent conductive structures.

The resistance value with all of the fuses 920 coupled will be the minimum possible within the electrical circuit. Accordingly, the value of the resistance between the electrical contacts 512 and 403 will have a resistance range whose minimum value is that provided with all of the resistors 901-905 coupled in parallel. If no change is made to the circuit, this is the value of the resistance that will be provided and the circuit will operate correctly but perhaps not be as well tuned as possible. As will be appreciated some tuning of the circuit may be desired in order to improve the quality factor Q of an amplifier stage as shown in FIG. 1A or to tune towards some other target circuit parameter. The circuit performance can be measured in the completed electrical circuit at wafer test or, in some instances, after packaging. If the performance of the circuit as formed could be improved by reducing the resistance, then one or more of the fuses 920 are blown in order to reduce the resistance between electrical contact 512 and electrical contact 403. The Q quality can therefore be improved by closely matching the resistive value to that which will provide the best circuit performance. The maximum resistance will be when the fuses that couple resistive networks 901-904 are blown and only the fuse coupling resistor 905 remains. The person which is customizing the amplifier performance, whether the manufacturer or the end user therefore has the opportunity to fine tune the resistive value in the circuit by blowing one or more selected fuses after the integrated circuit is formed.

This alternative embodiment of FIG. 12 may, of course, be used with other of the embodiments shown in FIGS. 9-11 in order to permit the final selection of the desired component to be made by a fuse selection after the manufacture has been completed rather than during the manufacturing of the integrated circuit. Of course, one benefit of the selection being made during the manufacture of the integrated circuit is that the manufacturer is able to test the characteristics of the resistive tree 501 and match that resistive value which is desired so that no fuse selection is necessary. The alternative embodiment of FIG. 12 provides the advantage, however, that the very same mask set is used for all embodiments. Additional masks need not be made for the possible different values which may be desired of the resistor. A single mask set can be used to make the structure of FIG. 12, thus saving the expenses of making multiple masks for each resistance value. The alternative embodiment of FIG. 12 provides the further benefit that testing and measurement of a key parameter need not be carried out during manufacture of the integrated circuit. The step of measuring a circuit parameter such as resistance, in the middle of the processing steps, inputting this to a computer and charging the mask set may be time consuming. The alternative embodiment of FIG. 12 permits all chips to be completely manufactured without performing such testing and changes in the mask layout and contact location. After the circuit is fully formed and the final components tested, such as the amplifier circuit as a whole, the resistance value for that circuit can be custom selected by blowing the appropriate fuses.

Generally, the embodiment of FIG. 12 will result in consuming more area since the conductive strip combination 912, 914 with the fuse 920 will be much larger in area than the single conductive strip 910. In addition, the spacing between adjacent resistors will be limited based on how closely adjacently fuses 920 can be spaced with respect to each other. Usually fuses must be spaced far apart to avoid contaminating each other when one is blown. Therefore, the embodiment of FIG. 12 has different characteristics and some disadvantages with respect to the circuit of FIGS. 5 and 9 while, on the other hand, the circuit of FIG. 12 has some advantages.

The illustrations of FIGS. 1-12 show exemplary electronic amplifier and filtering circuits, but other electronic circuits may also be fabricated. Some particular features of the circuit may often include a critical value component that impacts the quality of the overall circuit. The parameters of this feature are tested, either in a sample structure or the proposed structure itself and then that particular component which is the closest match to provide the highest quality of the overall circuit is selected for the final connection and use in the operating circuit.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an integrated circuit having an electronic component on a semiconductor substrate, comprising:
    forming a plurality of integrated circuit elements on the semiconductor substrate;
    forming a first contact node;
    forming a second contact node;
    forming a plurality of electrically conductive structures on the semiconductor substrate during a manufacturing process of the integrated circuit substrate, each structure being positioned between the first contact node and the second contact node, each structure having a first parameter, the first parameter of each structure being a different value from a corresponding first parameter in each other structure within the plurality of structures, each structure being physically integral with the first contact node and each structure have a substantial portion of it being physically integral with each of the other electrically conductive structures;
    sensing a value of a second parameter in each structure, the second parameter being one which correlates with the value of the first parameter in each structure of the plurality of structures, wherein the second parameter is substantially the same for each of the plurality of structures;
    selecting only one structure within the plurality of structures based upon the value of the second parameter, the selected structure having a value of the first parameter approximating a desired target value for the first parameter for an electrical connection between the first contact node and a third contact node;
    forming the electrical connection between the first contact node and the selected structure within the plurality of structures to the third contact node and maintaining electrical isolation between the second contact node and any of the other of the plurality of structures.

2. The method of claim 1, further comprising:
    forming a second plurality of structures; and
    forming an electrical connection between the plurality of structures and the second plurality of structures.

3. The method of claim 2 wherein the plurality of structures are formed with polysilicon.

4. The method of claim 2 wherein the second plurality of structures are formed with a metal layer.

5. The method of claim 1 wherein forming the plurality of structures includes forming a plurality of transistors, the plurality of transistors being configured as amplifiers.

6. The method of claim 5 wherein the first parameter is the gain of the plurality of transistors.

7. The method of claim 6 wherein the second parameter is a saturated current of the plurality of transistors.

8. The method of claim 1 wherein the first parameter is resistance of the plurality of structures.

9. The method of claim 1 wherein the second parameter is the resistivity of the material which comprises the structures.

10. The method according to claim 1 wherein the first parameter is the physical length of the electrically conductive structure.

11. The method according to claim 1 wherein the first parameter is the resistance of the electrically conductive structure.

12. The method according to claim 1 wherein the second parameter is the resistivity of polysilicon as measured in ohms per square.

* * * * *